United States Patent [19]
Parker

[11] Patent Number: 5,889,313
[45] Date of Patent: Mar. 30, 1999

[54] THREE-DIMENSIONAL ARCHITECTURE FOR SOLID STATE RADIATION DETECTORS

[75] Inventor: Sherwood Parker, Berkeley, Calif.

[73] Assignee: University of Hawaii, Honolulu, Hi.

[21] Appl. No.: 796,273

[22] Filed: Feb. 7, 1997

Related U.S. Application Data

[60] Provisional application No. 60/011,388 Feb. 8, 1996.
[51] Int. Cl.⁶ ................ H01L 31/115; H01L 31/0328; H01L 31/0336; H01L 31/072
[52] U.S. Cl. ............... 257/429; 257/185; 257/187; 257/191; 257/428; 250/370.09; 250/370.14
[58] Field of Search .................. 257/101, 191, 257/185, 187, 428–430, 458, 570; 250/370.09, 370.14

[56] References Cited

U.S. PATENT DOCUMENTS

| | | | |
|---|---|---|---|
| 4,472,728 | 9/1984 | Grant et al. | 257/430 |
| 4,618,380 | 10/1986 | Alcorn | 148/187 |
| 4,654,684 | 3/1987 | Vinal | 257/423 |
| 5,027,182 | 6/1991 | Kim et al. | 257/570 |
| 5,332,903 | 7/1994 | Buehler et al. | 250/370.14 |
| 5,448,082 | 9/1995 | Kim | 257/82 |
| 5,466,954 | 11/1995 | Aizpuru et al. | 257/187 |
| 5,552,596 | 9/1996 | Ravetto et al. | 250/208.1 |

Primary Examiner—Mahshid Saadat
Assistant Examiner—Allan R. Wilson
Attorney, Agent, or Firm—Flehr Hohbach Test Albritton & Herbert LLP

[57] ABSTRACT

A radiation-damage resistant radiation detector is formed on a substrate formed of a material doped with a first conductivity type dopant. The detector includes at least one first electrode formed of first conductivity type dopant, and at least one second electrode that is spaced-apart from the first electrode and formed of a second conductivity type dopant. Each first and second electrode penetrates into the substrate from a substrate surface, and one or more electrodes may penetrate entirely through the substrate, that is traversing from one surface to the other surface. Particulate and/or electromagnetic radiation penetrating at least a surface of the substrate releases electrons and holes in substrate regions. Because the electrodes may be formed entirely through the substrate thickness, the released charges will be a relatively small distance from at least a portion of such an electrode, e.g., a distance less than the substrate thickness. The electrons and/or holes traverse the small distance and are collected by said electrodes, thus promoting rapid detection of the radiation. By providing one or more electrodes with a dopant profile radially graded in a direction parallel to a substrate surface, an electric field results that promotes rapid collection of released electrons and said holes. Monolithic combinations of such detectors may be fabricated including CMOS electronics to process radiation signals.

19 Claims, 24 Drawing Sheets

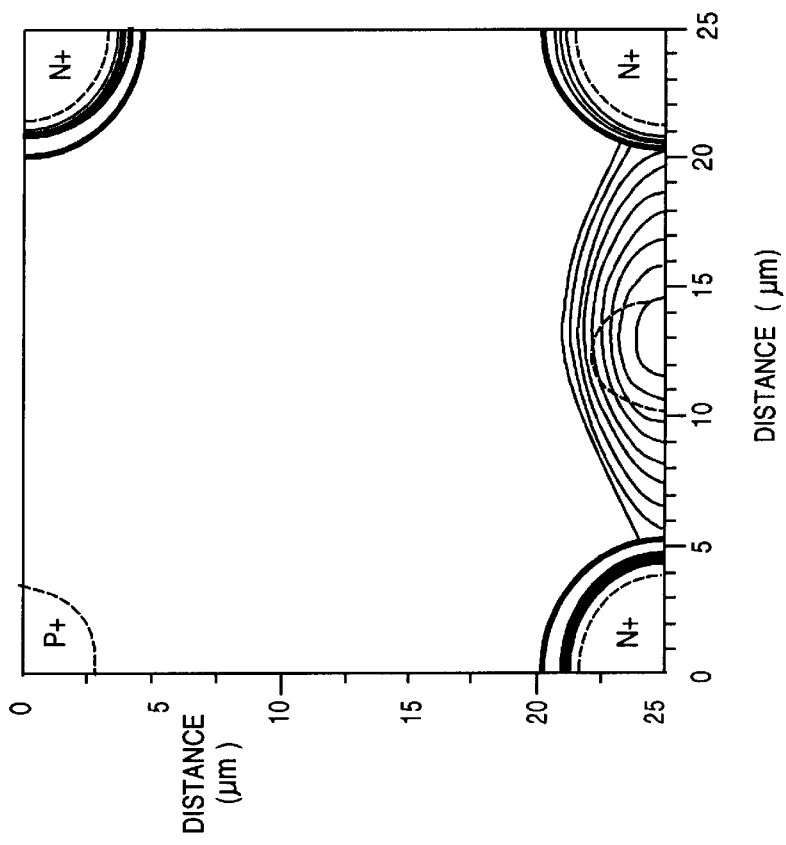
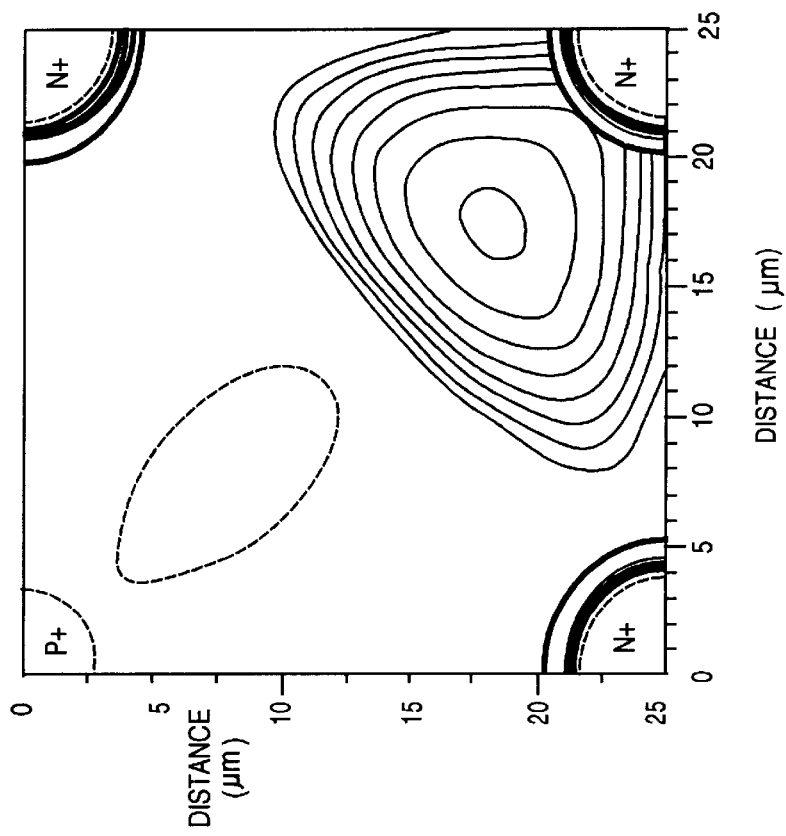

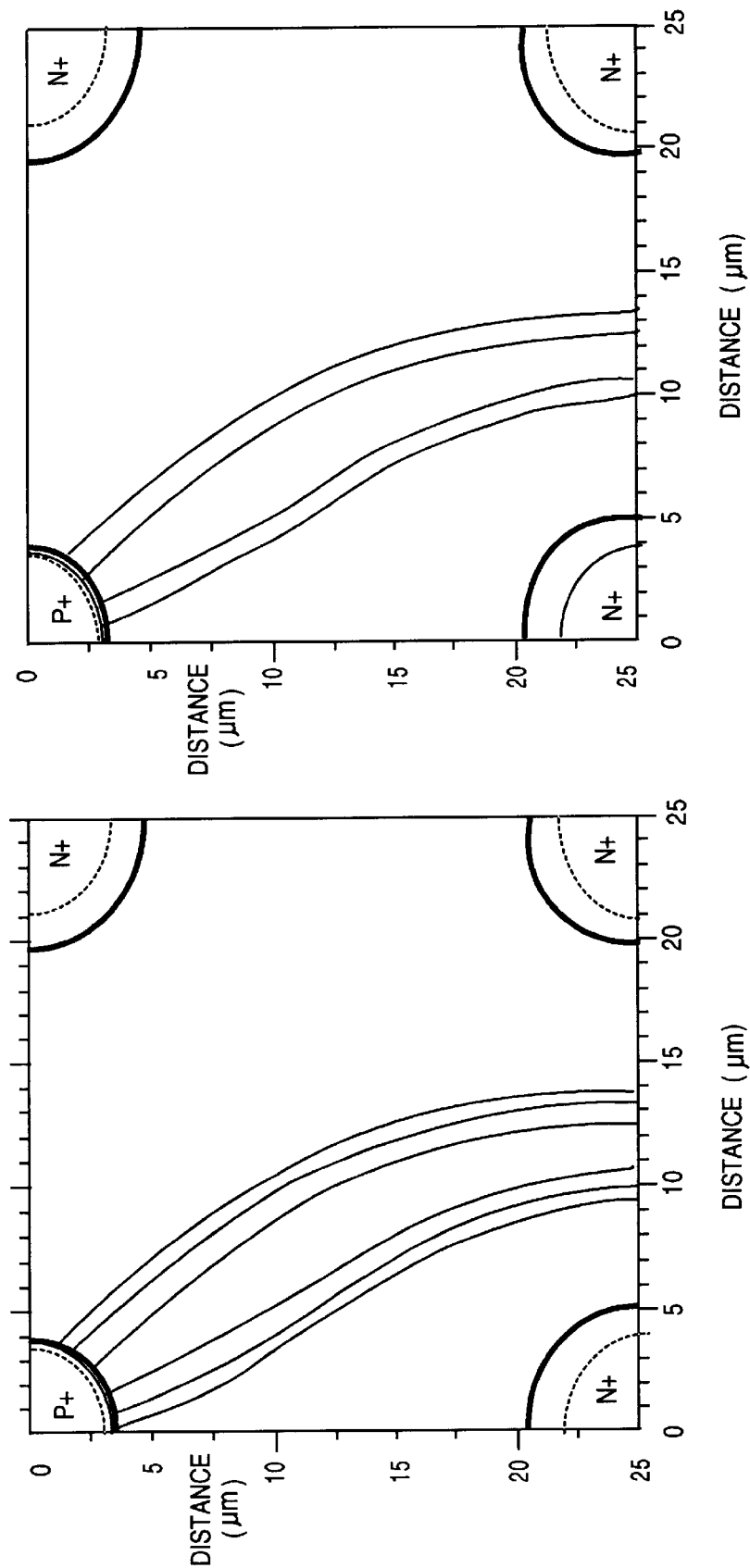

5,889,313

THREE-DIMENSIONAL ARCHITECTURE FOR SOLID STATE RADIATION DETECTORS

Said provisional application was developed with support from the U.S. Department of Energy under grant DE-FG0394ER40833, and the U.S. government may have rights to the within application.

RELATION TO PREVIOUSLY FILED APPLICATION

This is a continuation application from Provisional Patent application Ser. No. 60/011,388 filed Feb. 8, 1996, entitled "3D-A NEW ARCHITECTURE FOR SOLID STATE RADIATION DETECTORS", from which priority is claimed.

FIELD OF THE INVENTION

The present invention relates to solid state radiation detectors, and more specifically to detector architecture that promotes faster detection response.

BACKGROUND OF THE INVENTION

Solid state radiation detectors are known in the art, and provide a useful mechanism for detecting radiation. Such detectors have evolved from detectors using surface barrier electrodes, to ion-implanted electrodes.

Descriptions of such detectors and their uses may be found in applicant's article "A Proposed VLSI Pixel Device for Particle Detection", Nucl. Instr. and Meth. A275, 494 (1989), A342 59–77 (1994), and in U.S. Pat. Nos. 4,593,381, 5,237,197, 5,355,013, 5,461,653 and 5,465,002, among other references.

FIG. 1 depicts such a prior art radiation detector 10, which is more fully disclosed in U.S. Pat. No. 5,237,197 (in which applicant herein is co-inventor). In FIG. 1, a detector array 10 includes a preferably lightly doped P-type charge depletable substrate 20, having first and second surfaces 30 and 40 spaced-apart by a substrate thickness L of perhaps a few hundred microns. Substrate thicknesses in this range provide good sensitivity for collecting radiation-generated charge from within the substrate, as well as providing acceptable voltage breakdown levels, and protection from radiation damage.

Adjacent the first substrate surface 30 voltage-biasable doped well regions 50 of preferably N-type material are formed. Buffer well region 55 is formed of N-type or P-type material, depending upon the nature of the circuitry 60 in this well region. Well regions 50, 55 preferably are sufficiently highly doped to act as an electrostatic shield for underlying regions of the detection device. Electronics 60 may be fabricated within buffer well region 55.

Also adjacent first substrate surface 30 and separated from each other by the N-type well regions 50 are formed spaced-apart collection electrodes 70, preferably made from highly doped P-type material. Preferably the gate lead of one (or more than one) metal-oxide-semiconductor ("MOS") transistor 80 is coupled to each collection electrode 70. The lower surface of the substrate includes a preferably heavily doped N-diffusion region 90, beneath which is an electrode (not shown), and isolation regions 100. Of course, the conductivity types of the materials used to form detector 10 could be reversed, e.g., substituting P-type for N-type and vice versa.

One collection electrode 70, its associated MOS device 80, and indeed the associated underlying semiconductor structure may collectively be termed a "pixel", and the terms pixel and detector may be used interchangeably. It is seen from FIG. 1 that P-type collection electrodes 70 and P-type substrate 20 form a plurality of PN diode junctions with the N-type well regions 50 adjacent the first surface.

In practice, a well bias voltage of many volts is coupled between the collection electrode regions and bottom regions and N-doped well regions. The resultant electric fields extend from the second surface 40 toward and to the first surface 30. The resultant depletion region extends through the perhaps 300 $\mu$m thickness of the substrate, whereupon a plurality of P-I-N diodes are formed by P-type collection regions 60, intrinsic substrate region 20, and N-type region 90.

The biasing causes force lines to emanate from the N-diffusion region 90 through the substrate thickness and focus upon the P-type collection electrodes 70. Incoming radiation (not shown) releases charge within the substrate, which charge is focused by the force lines and caused to be collected by the electrodes 70. As noted, N-wells 50 further serve as a Faraday shield for the array of pixels in structure 10. As noted, well regions 50, 55 can also serve as areas in which electronics are fabricated. Unfortunately, CMOS electronics that require wells of both dopant conductivity types can present a problem. Such CMOS electronics can be accommodated in the area over the active detection region, providing wells of like-conductivity type as the collection electrodes are implanted completely within wells of the opposite conductivity type. Understandably, if same-type wells were to be formed directly on the depleted silicon substrate, the wells would collect ionization charge on the substrate, which charges would not be collected and detected by the collection electrodes and assorted circuitry.

But as noted in the U.S. Pat. No. 5,237,197 patent, detector 10 can nonetheless function reasonably well because the wells surrounding the collection electrodes were doped with opposite type dopant and were back-biased relative to the collection electrodes. This configuration caused electric field lines to be directed to carry one sign of ionization charge from the substrate and the well to the collection electrodes. Like-signal wells, needed for CMOS electronics, were placed along the structure edges, beyond the sensitive detection area. Even though only perhaps 10% of upper surface 30 may be covered by collection electrodes, efficiency in the sensitive regions is extremely high with more than 99.99% of the radiation-induced charges being collected by electrodes 70. The collection electrodes preferably are uniformly distributed in a two-dimensional array on the surface, to provide resultant uniform array sensitivity and spatial resolution.

Once the radiation-induced charge has been collected by the collection electrodes 70, the transfer to an associated MOS device(s) can be rapid as the distance is now but a few microns. Further, because there is small capacitance (C) at the MOS gate, the charge (q) developed by the incoming X-ray radiation can produce a substantial voltage signal (v), since v≈q/C. Electronics 60 may be used to signal process the charge associated with the MOS devices. For example the collected charge at a MOS gate may be used to modulate readout current caused to flow through the MOS device. Such readout may be made on an addressable row-column basis.

As noted, radiation detection sensitivity for prior art detector 10 can be very high. But radiation-induced charge cannot be detected until it has been collected by the surface-located collection electrodes 70. Unfortunately the collection or drift path that released charge must traverse before being collected can be very long, e.g., comparable to the few hundred micron full substrate thickness. Of course should some radiation-generated charge happen to be released closer to the collection electrode surface, collection of the charge can occur in a shorter time. In practice, prior art detectors using two-dimensional electrodes such as shown in FIG. 1, or the common silicon strip technology that preceded what is shown in FIG. 1, may take upwards of 25 ns for charge-produced signals to return to a baseline level from a peak. Of course, amplifier delays may extend this time even further.

Attempting to reduce radiation detection time by using a thinner substrate is counter productive because thinner substrates have shorter tracks, and therefor less signal charge. Also, thinner materials can break more readily during fabrication. It would also be desirable to provide a detector structure that is kept small in size in the presence of radiation damage, requiring a smaller voltage magnitude to achieve depletion, while still preventing so-called bulk type-reversals. Finally, in many detection environments it is necessary to continuously refrigerate the detector, even for maintenance.

Thus, there is a need for a sensitive solid state radiation detector having improved detection response times. Such detector should also provide good voltage breakdown, not require excessively high depletion voltages, and exhibit good radiation damage resistance characteristics. Further, such detector should permit implementing a monolithic combination of collection electrodes and CMOS electronics, without thereby hindering collection of released charge. Finally, such a detector should function without the need for operation at low temperatures.

The present invention provides such a detector, and a method for its fabrication.

SUMMARY OF THE INVENTION

A three-dimensional solid-state radiation detector is fabricated on a substrate formed of a material doped with a first conductivity type dopant, whose first and second surfaces are separated by the bulk thickness, which may be several hundred microns. The detector includes at least one first electrode formed of the same first conductivity type dopant and penetrating from one of the surfaces at least partially into if not completely through the substrate bulk. The detector also includes at least a one second electrode that is spaced-apart from the first electrode. The second electrode is formed of an opposite conductivity type dopant and penetrates from either of the surfaces at least partially into if not completely through the substrate bulk.

The three-dimensional electrodes preferably penetrate entirely through the substrate bulk. As a result, detectable particulate and/or electromagnetic radiation that penetrates at least one substrate surface and releases electrons and holes in substrate regions, releases them at a relatively small distance from at least a portion of one of the electrodes. Accordingly, radiation-induced electrons and/or holes only have to traverse a small distance before being collected by an electrode, which enables rapid detection of the incoming radiation. Electrons and/or holes traverse the small distance and may be collected by the electrodes an order of magnitude faster than if a prior art two-dimension electrode detector were used.

The electrodes may be formed by first defining electrode column-like holes in the substrate, and then filling the holes and making them conductive, for silicon-based detectors, preferably with silane-produced polysilicon that is doped. Electrodes with a dopant profile radially graded in a direction parallel to a substrate surface will have an electric field that promotes self-depletion and rapid collection of released electrons and holes. Alternatively, first electrodes might be formed using a suitably high energy ion implanter to implant first conductivity type dopant through openings in a first mask. Next, opposite conductivity type dopant is implanted through openings in a second mask to form the second electrodes.

An externally applied potential normally will be coupled between the first and second electrodes to further promote substrate depletion and to increase the inter-electrode electric field magnitude present to help guide release charge to adjacent electrodes for collection.

The disclosed three-dimensional architecture advantageously permits a monolithic combination of collection electrodes and CMOS electronics. The well structure for the CMOS electronics is such that substantially all charge is collected by the collection electrodes. As a result, only a small fraction of charges remain to be collected by the well structure, and thus lost for measurement purposes.

Other features and advantages of the invention will appear from the following description in which the preferred embodiments have been set forth in detail, in conjunction with the accompanying drawings.

BRIEF DESCRIPTION OF THE DRAWINGS

FIGS. 7A–7L depict charge density contours for electron-hole pairs in a quarter-cell having 10 V potential, $10^{12}$/cc dopant concentration, according to the present invention;

DETAILED DESCRIPTION OF THE PREFERRED EMBODIMENTS

The present invention provides architecture for solid-state radiation detectors in which a three-dimensional array of electrodes penetrates into and possibly entirely through the substrate bulk. The resultant structure reduces charge collection distances and calculated collection times by about one order of magnitude relative to what is realized using prior art planar technology strip and pixel detectors with detector surface electrodes. In addition, the three-dimensional architecture permits use of depletion voltages that are about one-to-two orders of magnitude lower that what is required for prior art detectors. Further, the disclosed architecture enables maximum substrate thickness, often an important consideration for x-ray and gamma-ray detection, to be constrained by the electrode length, rather than by material purity or depletion-depth limitations due to voltage breakdown.

A three-dimensional solid-state detector according to the present invention has increased resistance to radiation damage. As such, the detector is especially useful in environments such as high intensity colliders, wherein prior art detectors would experience severe bulk radiation damage rendering them inoperable.

Figure 1:
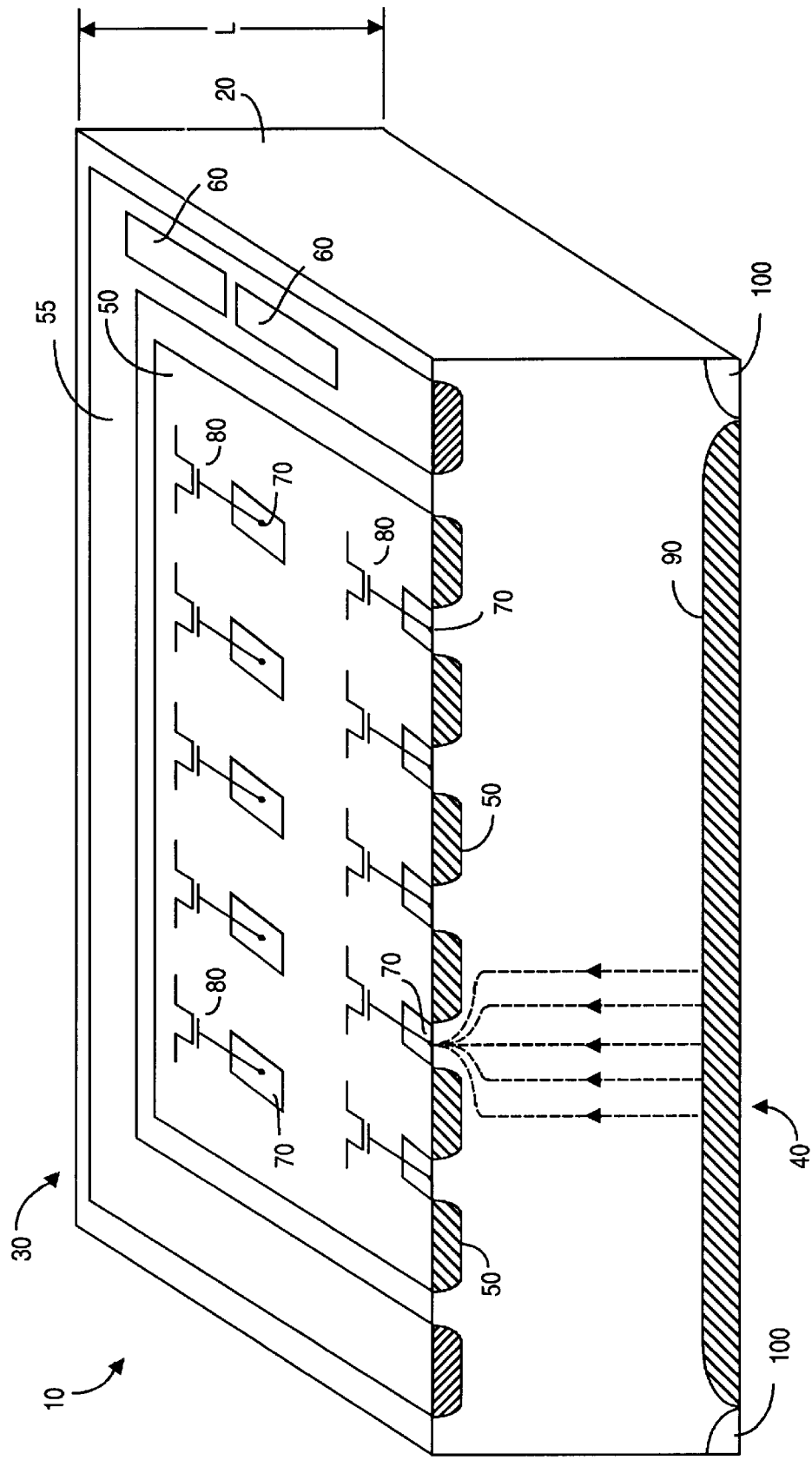
FIG. 1 depicts a radiation detector, according to the prior art.
Figure 2A:
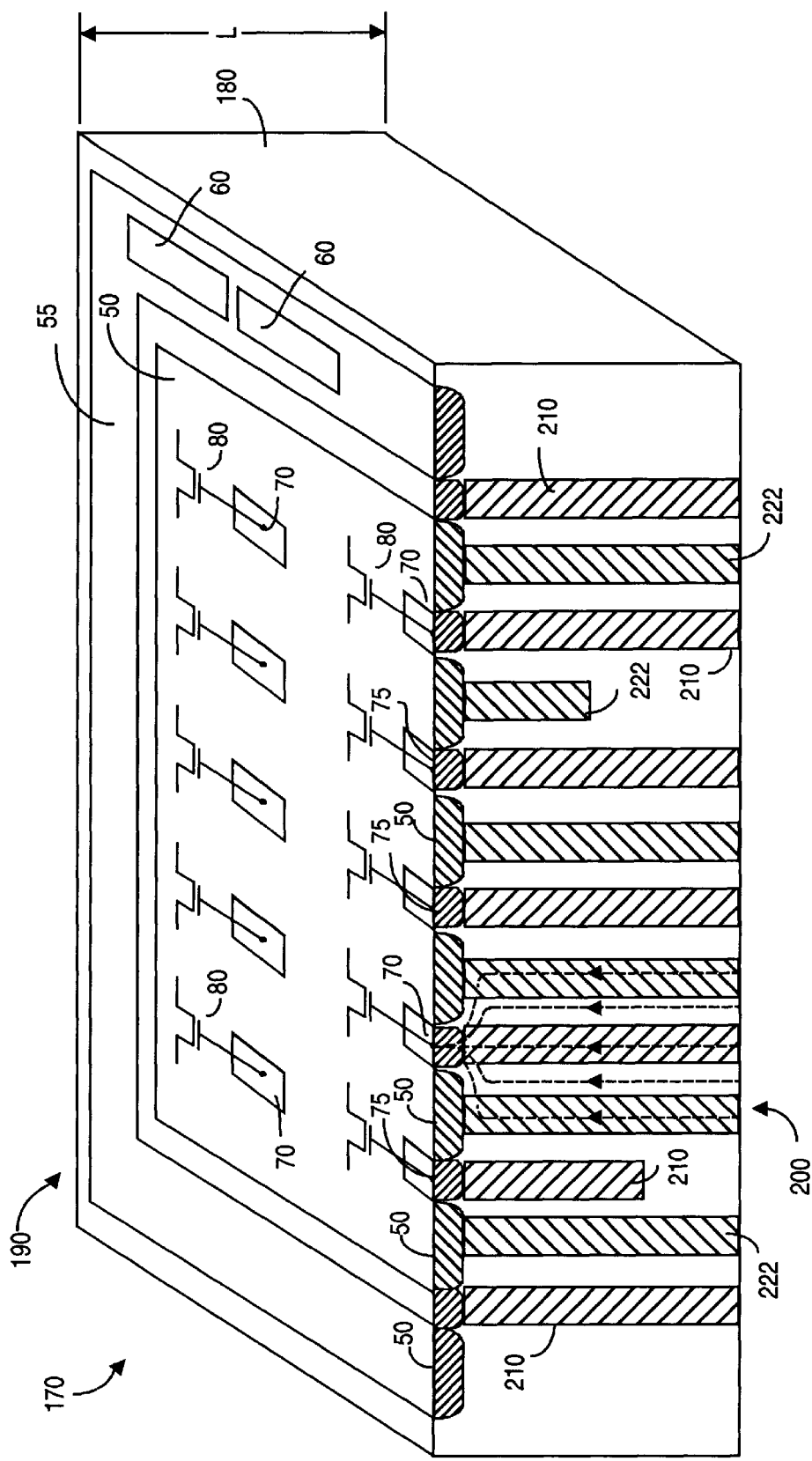
FIG. 2A depicts a monolithic structure with radiation detectors with three-dimensional collection electrodes, according to the present invention.

FIG. 2A depicts a monolithic structure embodiment of a radiation-damage resistant radiation detector 170 according to the present invention. However, it is to be understood that non-monolithic detector systems may also be realized with the present invention. Detector 170 is formed on a preferably lightly doped P-type charge depletable substrate 180 having spaced-apart first and second surfaces 190 and 200 and a substrate thickness L that is perhaps a few hundred microns. In contrast to the two-dimensional electrode array of prior art FIG. 1, note in FIG. 2A that P-type electrodes 210 descend from P-implants (or wells) that serve as collection electrodes 75 formed from the upper substrate surface 190 substantially into if not completely through the substrate thickness to the lower surface 200. Note too that N-type electrodes 222 descend from N-wells 50 formed at the upper substrate surface and descend substantially into if not completely through the substrate thickness. CMOS type circuitry may advantageously be disposed within well 50 and/or wells 55 (it being understood that wells 55 may include P-type, and/or N-type structures, depending upon the nature of the electronics to be included), to measure charge from collection electrodes, e.g., 210, as well as to signal process resultant charge signals.

Figure 2B:
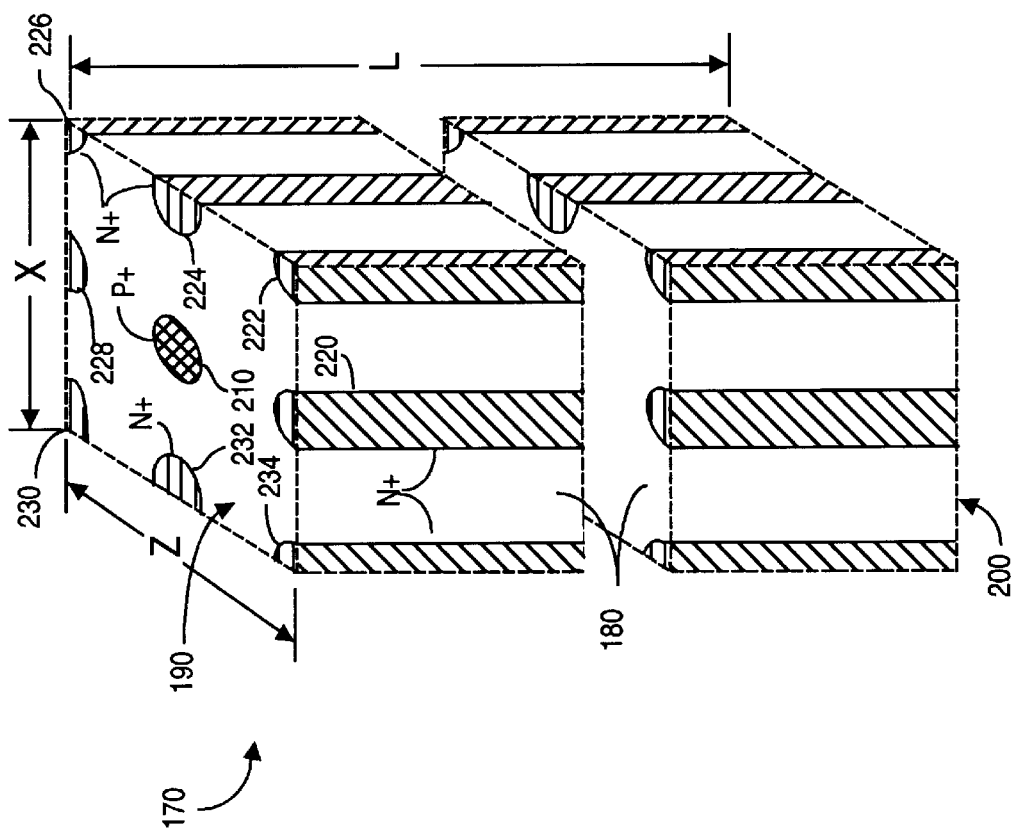
FIG. 2B depicts a single cell portion of a basic radiation detector, according to the present invention.

FIG. 2B depicts a quarter-cell portion of a unit basic radiation detector such as detector 170. For clarity in FIG. 2B, detector 170 is formed on a substrate bulk 180 having spaced-apart first and second surfaces 190 and 200. Detector 170 is shown as though cut in half lengthwise, with the two halves slightly pulled apart to provide a better understanding of the structure. Substrate thickness L is perhaps a few hundred microns, and the X and Z dimensions of the unit detector cell shown in FIG. 2B may be in the range of perhaps 20–100 $\mu$m. Of course different X, Y, and/or L dimensions may be used.

Extending into if not through the detector bulk are one or more electrodes, including a preferably P+doped electrode 210, and N+electrodes shown as 220, 222, 224, 226, 228, 230, 232, and 234. The electrode spaced-apart distance or pitch typically may range from about 10 $\mu$m at present (and likely 5 $\mu$m or less in a few years as better fabrication equipment is available) up to a distance comparable to substrate thickness L. The electrode depth may be a small fraction of the total substrate thickness L, perhaps 5%, but preferably the electrode depth (or length) is equal to the entire substrate thickness, e.g., 100%. Through-substrate electrode lengths are preferred as the resulting short charge collection distances provide fast charge collection while permitting use of low depletion voltages.

The quarter-cell configuration of FIG. 2A was examined as to voltage distributions, using MEDICI modeling software available from Technology Modeling Associates Inc., of Palo Alto, Calif. Calculations were also made using a sequential-over-relaxation method described by K. Binns and P. Lawrenson, "Analysis and computation of electric and magnetic field problems, (Pergamon, 1973) p. 241. (For the latter analysis, symmetric boundary conditions (Vi+1, j,k)=v(i−1,j,k) were used for the (cubic) cells, on either side of a boundary at a plane i=constant, where V represents voltages at cell centers. At silicon-insulator boundaries, a next voltage for any cube is found from the average of the four adjoining voltages on the boundary and the adjoining voltage further into the silicon (plus the usual term from fixed charges). This reflects that in equilibrium, there is no net charge transport into the cube. Thus, the sum of current across the five cell faces, as well as the five voltage differences, are zero. In this approximation, surface currents were neglected, and effects of induced charges were calculated using Ramo's theorem as set forth in S. Ramo, "Currents induced by electron motion", Proc. of the I.R.E., 27 (1939) 584. Coulomb forces were approximated by subdividing 24,000 electron-hole pairs from a typical minimum-ionization track into packets of 40 charges each, which diffused and drifted as a group. Results did not change significantly when the packet size was changed.

Of the two computation methods, presently only MEDICI can calculate fields and current flow in the presence of surfaces and undepleted silicon. When both methods could be used to analyze the same problem, results generally agreed.

Depletion voltages for the sample diode shown in FIG. 2B were 1.6V, 1.8V, 3.8V, and 8.8V for dopant concentrations of $10^{12}$, $3 \times 10^{12}$, $10^{13}$, and $3 \times 10^{13}$ dopant atoms/cc., including a contribution from the built-in voltage at the electrodes ranging from about 0.7V to 0.8V. The values are not proportional to the dopant concentrations because in the course of fully depleting the lightly doped silicon substrate, part of the heavily doped region around the electrodes is also depleted. Applicant's prototype pixel detectors had a doping concentration of $1.2 \times 10^{12}$ dopant atoms/cc. It is anticipated that a 10 year exposure for such pixel detectors in a potentially bulk-damaging environment would not increase doping much beyond about $10^{13}$ dopant atoms/cc.

As noted, because the path from a radiation-induced charge to a nearest collection electrode can be substantially shorter than the distance L, collection times for detector 170 are rather fast. Rapid collection time is especially useful in a quantum mammography system proposed by applicant, in which individual x-ray radiation hit locations are recorded.

Further, the dual benefits of fast collection and low depletion voltage will be particularly useful in high luminosity collider environments, in which prior art detectors face severe problems both from high event rates and from increased depletion voltages due to bulk radiation damage. Use of detection devices according to the present invention will advantageously eliminate the need for high depletion voltages, and the need to refrigerate the detector continuously, even during maintenance.

Fabrication of a detector according to the present invention can be carried out as follows. Initially column-like holes are formed in substrate 180. These holes penetrate from the substrate surface 190 at least partially into the substrate bulk, and preferably entirely through the substrate bulk, e.g., through lower bulk surface 200. Preferably these holes define cross-sectional dimensions having a transverse dimension ranging from about 0.5 $\mu$m to about 25 $\mu$m. As noted, the columnar length of these hole openings may vary from about 5% to preferably 100% of the substrate thickness.

Aside from fabrication equipment capabilities, other factors should also be considered in deciding diameter (or transverse dimension) of the holes to be formed. On one hand, the electrode will exhibit an electrode capacity (C) that advantageously is reduced with smaller diameters. Note that smaller diameter electrodes will decrease any inefficiency in collection of ionization charge. However, on the other hand, electrode resistance and maximum electric fields disadvantageously increase with electrodes formed in smaller diameter holes.

For a 300 $\mu$m long electrode, the capacity C is about 0.1 pF. The electrode (resistance)×(capacitance) or RC product is related to the least time required for pulses to leave the electrodes. RC is about 90 ps for N+ electrodes, and is about 225 ps for P+ electrodes. For some (but not all) detector structures, the magnitude of R may also play a role in the noise performance, depending upon sensitivity of the electronics to which the electrode is coupled. If especially low resistance electrodes were required, one could selectively deposit tungsten in the central core of the holes. However, such measures are not deemed necessary for pixel detectors using three-dimensional electrodes, as disclosed herein.

To a first approximation, the initial signal developed on the electrodes due to released charge (q), q/$C$electrode' is independent of wafer thickness (L) for penetrating ionizing particles, as electrode capacitance $C_{electrode}$ is approximately proportional to the thickness. In later stages of some electronic readout systems thinner wafers may produce smaller signals. However, any degradation of signal-to-noise ratio will be less rapid using detectors with three-dimensional electrodes, than would be the case for prior art planar two-dimensional electrode structures, as shorter electrodes have lower capacitance. If thinner substrate detectors are deemed desirable, perhaps due to multiple Coulomb scattering considerations, it is like that fabrication equipment and wafer handling considerations will set the lower limit on substrate thickness. However, thinner wafers should actually permit smaller hole diameters to be fabricated, resulting in a decrease in $C_{electrode}$.

Having decided upon suitable dimensions, the holes for the electrodes are formed preferably using deep reactive-ion etching ("RIE"), a process that can provide holes having depth-to-width ratios of 15:1 or greater.

In practice, etch-formed holes having a diameter of 15 $\mu$m and a length of 200 $\mu$m, with a top-to-bottom taper in the resultant hole-column of less than about 0.1 $\mu$m are readily fabricated. Holes of 10 $\mu$m in diameter have been etched, and as fabrication equipment and techniques continue to improve, smaller diameter holes should also be realizable. This advantageously implies small capacitance associated with the smaller diameter electrodes.

The columnar holes into or through the substrate are then made conductive, to form collection electrodes, according to the present invention. For silicon substrate-based detectors, the column-like holes are preferably filled with silicon, for example as the result of a surface recombination with a silane gas. Using a silane process is advantageous because the silane rebounds (or "bounces") off the silicon hole-wall surfaces many times before reacting, ensuring good silicon deposition throughout the length of the column-like holes.

Dopant gases preferably exhibiting similar behavior can be added to the silane as the holes are filled. For example, diborane and phosphine, when added to the silane, allow the fabrication of P+ and N+ electrodes respectively, e.g., P+ electrode 210 and N+ electrodes 220 in FIG. 2B. Silane, diborane, and phosphine each advantageously yield conformal coatings without tending to close or clog the hole opening before covering the hole-column bottom region. In practice, silicon layers deposited simultaneously on the wafer surfaces will have a thickness somewhat greater than the hole radius, and can be readily removed by etching.

In addition to experimenting to determine a smallest etch-formed hole size realizable with the equipment at hand, applicant investigated possible hole-filling electrode materials. Investigations were undertaken to determine whether the hole could be filled with single-crystal silicon (epitaxial, or "epi"), or whether polycrystalline silicon (polysilicon) should be used as fill material to form electrodes.

Epitaxial material is generally more difficult to fabricate than polysilicon, but nonetheless ia may be possible to use epitaxial to fill clean electrode holes that were undamaged during etching, since the interior hole surfaces are single crystal silicon. An epitaxial fill material could advantageously be combined with a gradually increasing dopant level during deposition. Following annealing, a radial dopant gradient results, providing a radial built-in electric field. (Even with uniform doping, a dopant gradient will be present even after annealing, but the gradient will be smaller.) This field will transport ionization charges in the same direction as the applied field, providing rapid charge collection from the entire volume of the detector, including the electrodes.

Following a fill deposition, the silicon is heated so the dopant atoms move to lattice sites and become electrically active. The dopant atoms also diffuse out from the N+ electrodes into the P substrate bulk and form P-N junctions in high-quality silicon. By contrast, using polysilicon fill material, diffusion of dopant atoms follows grain boundaries and is far faster than in single crystal silicon. Thus, for polysilicon fill electrode material, a nearly uniform doping density is established in the electrode. Unfortunately, such uniformity reduces the magnitude of the built-in field in the electrodes. Diffusion of ionization charge from the track to the start of an applied field several microns away, possibly with a small boost from Coulomb repulsion from the remainder of the track, appears necessary for collection. (Further details as to charge collection are provided later herein.) Recombination within the electrodes may not be a problem, as measurements made using 20 $\Omega$-cm epi in a charge-coupled device ("CCD") vertex detector show diffusion lengths of about 200 $\mu$m.

Once electrodes, e.g., 210, 220, have been formed, fabrication steps can be varied to produce monolithic pixel (or diode) detectors, bump-bonded pixel detectors, and strip detectors, with or without on-chip driving electronics associated with the bulk electrodes.

Although silicon is a most commonly used material for substrate 180, GaAs may be an even better candidate material. In general, larger substrate thicknesses provide good X-ray and gamma-ray detection efficiencies, but overly large thickness can introduce drift-length limitations. But the present invention may advantageously provide electrode spacings that are less than those drift length limitations, thus providing short maximum drift distances.

If the substrate material is GaAs, a material providing high electron mobility, the resultant detector 170 will provide very fast, probably sub-nanosecond, response times. Substrate-thick column-holes may be etched in GaAs and filled using metal organic chemical vapor deposition, for example with trimethyl gallium and arsine. A GaAs detector would circumvent limitations on maximum drift distances associated with a silicon substrate, and contribute to an efficient X-ray detector. Because of the low depletion voltages associated with GaAs, one could maintain the electric field near magnitudes that give high drift velocities, to achieve sub-nanosecond collection times. Such a GaAs detector, if combined with pixel readout parallel processing could handle very high rates indeed.

Figure 3B:
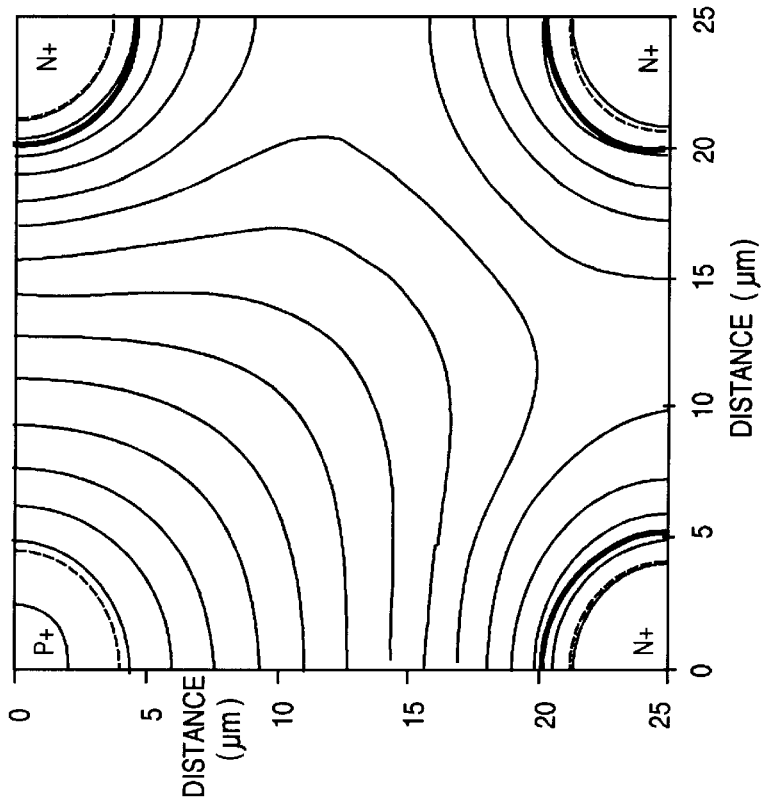
FIGS. 3A–3D depict equipotentials for one-quarter of the unit cell of FIG. 2B for different dopant concentrations and applied potential, according to the present invention.
Figure 3A:
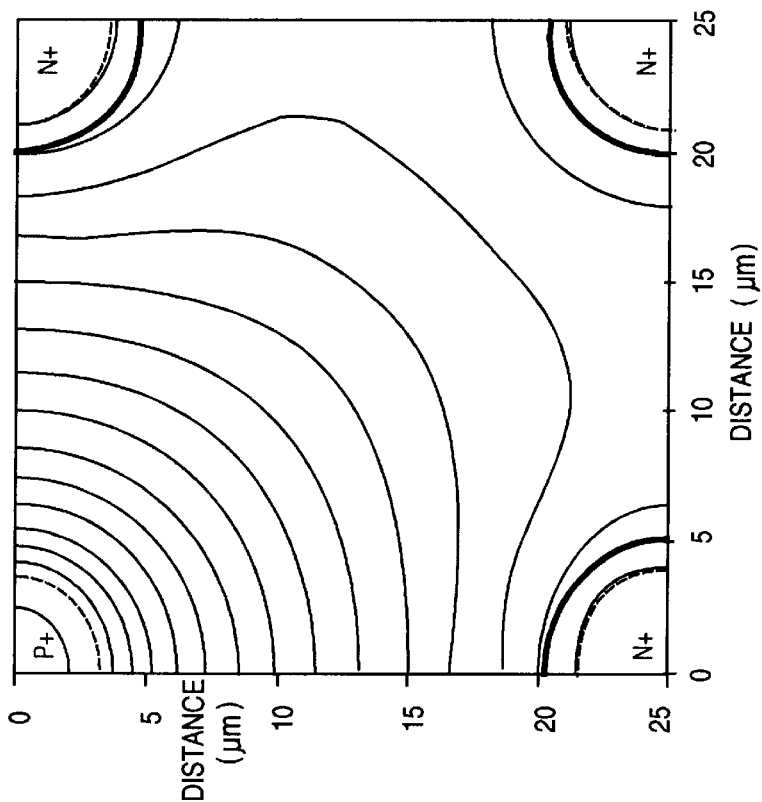

FIG. 3A depicts equipotentials for one-quarter of the unit cell 200 shown in FIG. 2B, with $10^{12}$ substrate dopant atoms per cm$^3$, and 5 V applied between the two metal electrodes. It is understood that what is shown in FIG. 3I (and other quarter-cell depictions herein) is a portion of cell 170 centered on P+ electrode 210, and showing portions of N+ electrodes 220, 22, 224. In FIGS. 3A–3D, a solid heavy line depicts the N-P junctions, and a dashed line is used to depict the boundaries of the depleted region.

The cylindrical electrode doping profile assumed for the configuration of FIG. 3A and indeed throughout this application is:

$$10^{18} \cdot e^{-(r/r_o)^2}$$

where $r_o$ is elected to bring the dopant concentration to $10^{12}$/cc at a distance r=5 $\mu$m. This profile produces N+ electrodes having a resistance of about 3 $\Omega/\mu$m, and P+ electrodes with a resistance of about 7.5 $\Omega/\mu$m.

Figure 3D:
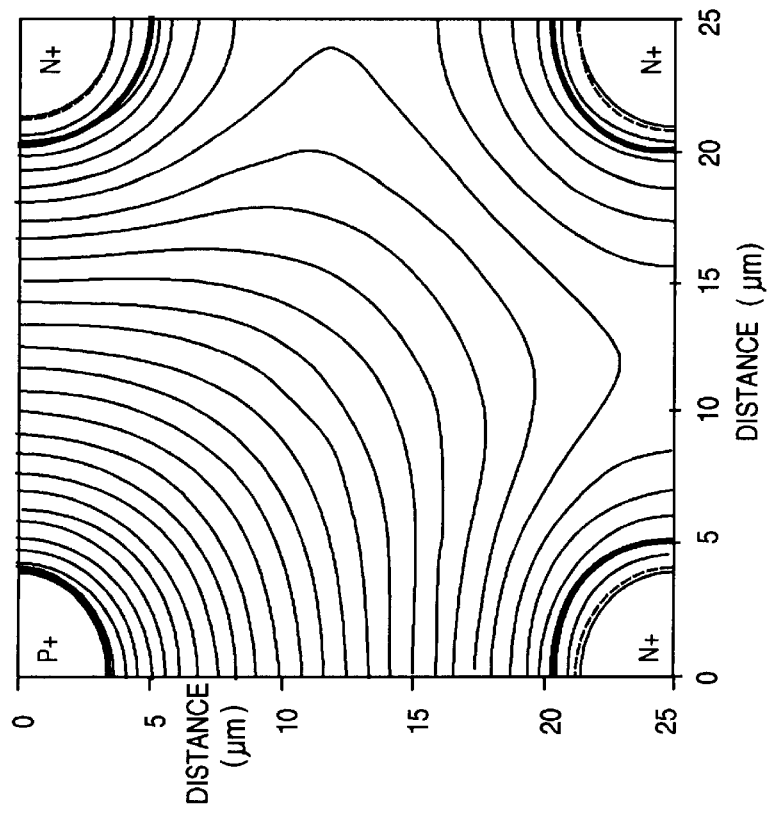
Figure 3C:
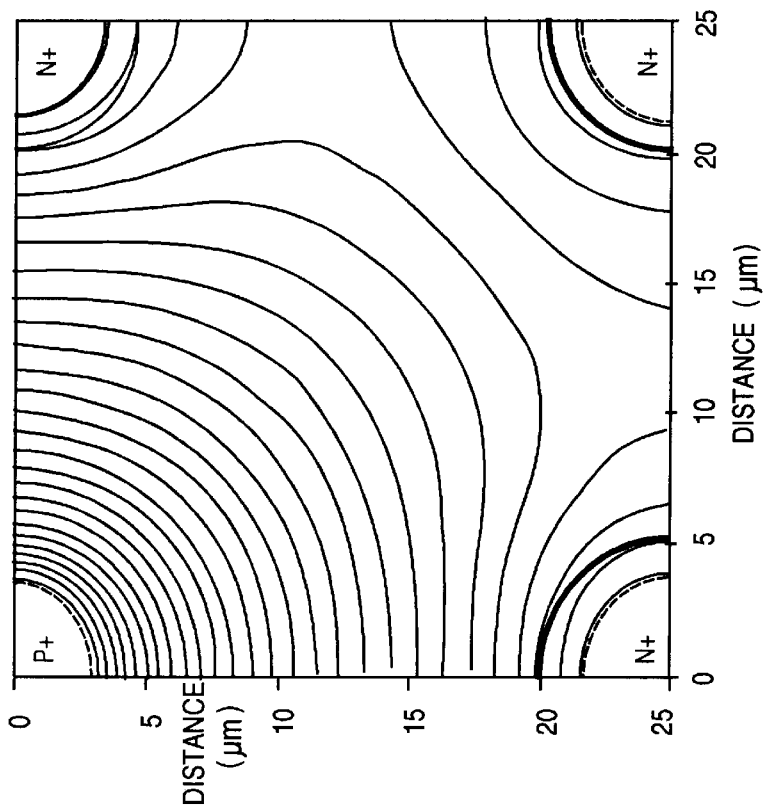

FIG. 3B is similar to FIG. 3A except that the substrate dopant concentration is raised to $10^{13}$/cc. In FIG. 3C, dopant concentration is again $10^{12}$/cc but the inter-electrode potential is raised to 10 V. FIG. 3D is similar to FIG. 3C except dopant concentration is raised to $10^{13}$/cc. The effects of surface charges are not included in FIGS. 3A–3D. FIGS. 3A–3D do depict the absence of cylindrical symmetry in the fields and depletion depths into the electrodes. The lack of such symmetry is especially apparent for N+ electrodes 220, 224, which are adjacent to P+ electrode 210. Also apparent is the decrease in low-field volume for the heavier substrate doping cases shown in FIGS. 3B and 3D.

Figure 4:
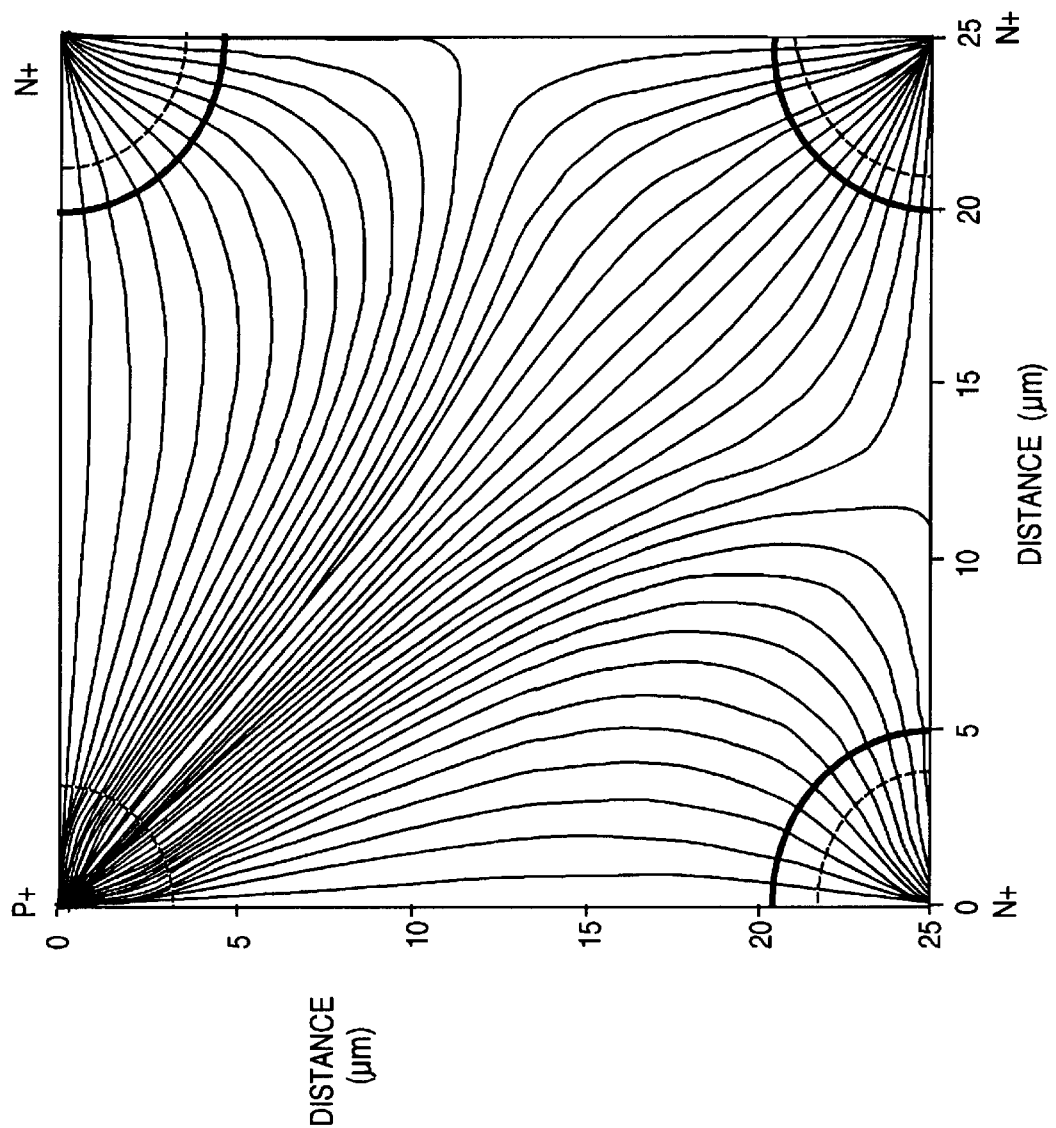
FIG. 4 depicts drift lines for a quarter-cell configuration for 5 V potential and $10^{12}$ dopant atoms/cc, according to the present invention.

FIG. 4 depicts the drift lines present in a quarter-cell for the case of $10^{12}$/cc dopant concentration and 5 V potential. Again, a heavy line denotes the N-P junctions, while a dashed line depicts the boundaries of the depleted region.

Figures 5A, 5B:
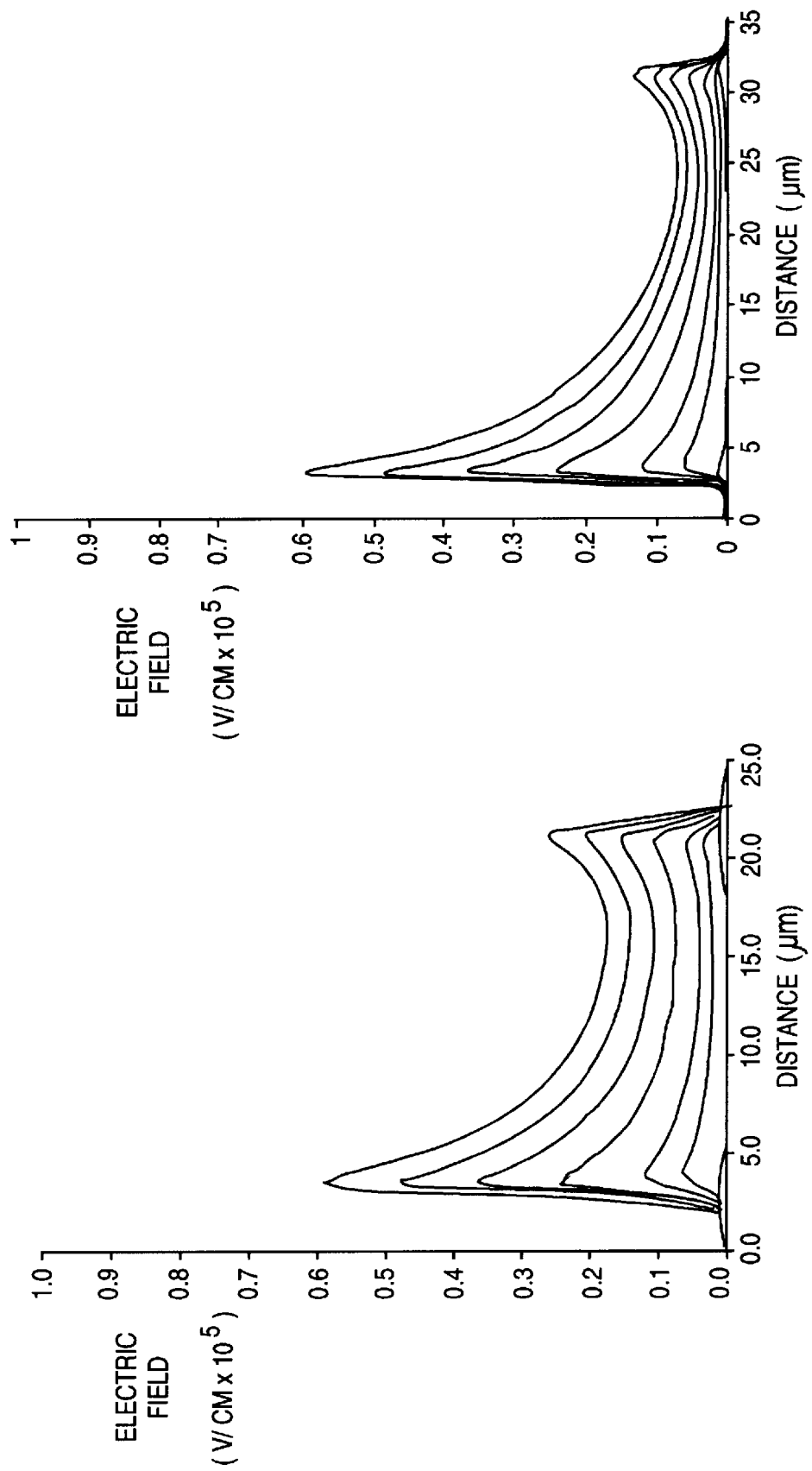
FIGS. 5A–5C depict electric field magnitudes along different lines for a quarter-cell configuration, according to the present invention.
Figures 5C, 5D:
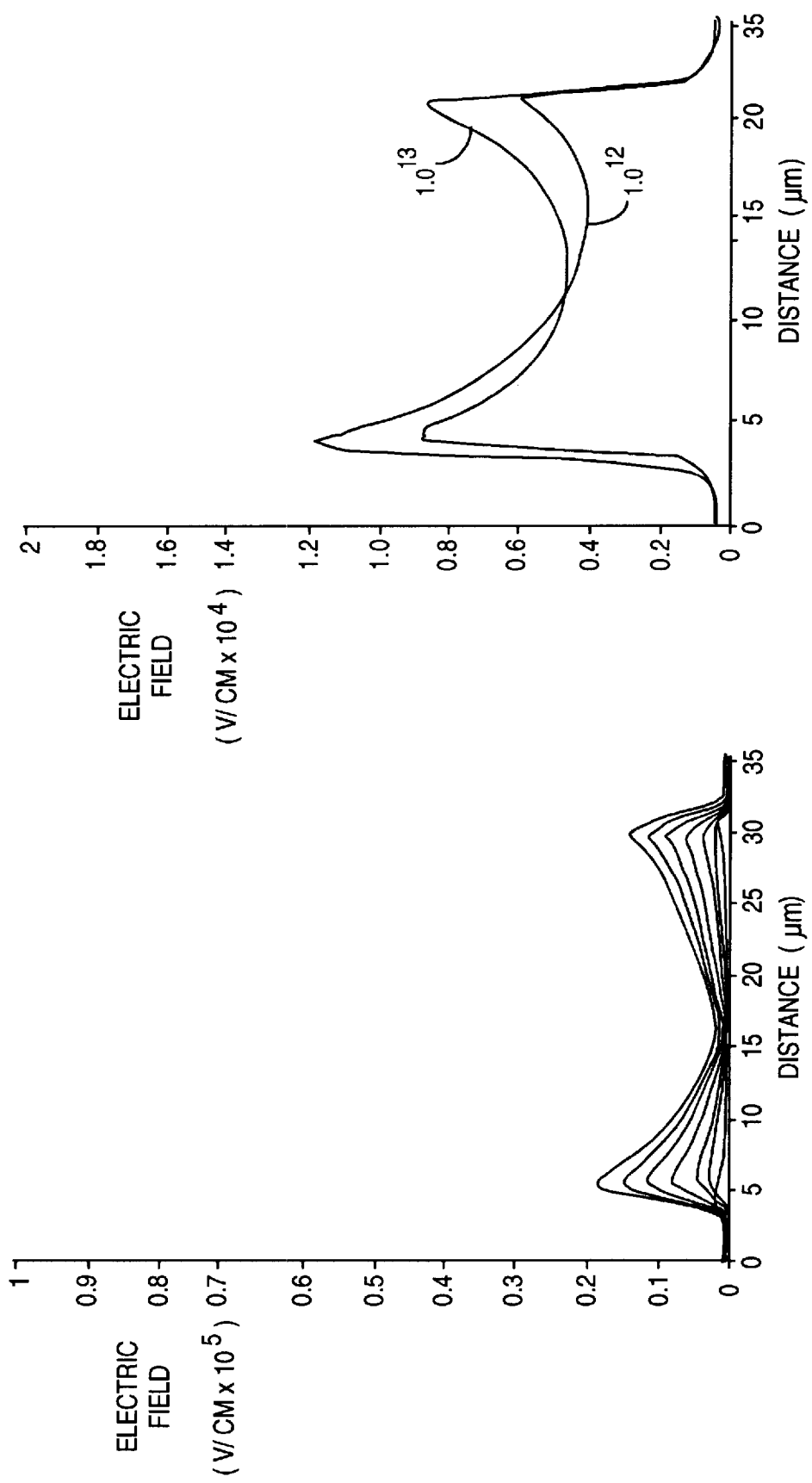
FIG. 5D is a comparison of electric field magnitudes for a quarter-cell configuration for different substrate dopant concentrations, according to the present invention.

FIG. 5A depicts electric field magnitudes for a quarter-cell along lines from the P+ electrode 210 to an adjacent N+ electrode, electrodes 220 or 224, for a doping concentration of $10^{12}$ dopant/atoms per cc. The electric field magnitudes represent applied voltages of 50 V (uppermost trace), 40 V, 30 V, 20 V, 10 V, 5 V, and 0 V (bottommost trace). FIG. 5B is a similar representation except the electric field magnitudes are along a line from P+ electrode 210 to diagonal N+ electrode 222. In FIG. 5C, the electric field magnitudes are along a line from an N+ electrode to an adjacent N+ electrode, e.g., from electrode 222 to 220, or electrode 222 to 224.

In FIGS. 5A–5C, 5V (the next-to-bottom trace) is more than sufficient potential to produce full depletion. Especially advantageously, peak electric fields are more than an order of magnitude below typically 100,000 V/cm avalanche field strengths.

FIG. 5D compares electric field magnitudes for a quarter-cell measured along a line from P+ electrode 210 to adjacent N+ electrode 220 or 224, e.g., for the case shown in FIG. 5A. In FIG. 5D, 10 V potential was used, and the two curves represent substrate dopant concentrations of $10^{12}$/cc and $10^{13}$/cc. Note that the peak electric fields actually decrease as substrate doping increases by a factor of 10. The higher substrate dopant level is somewhat analogous to what may occur with radiation damage. Peak fields, located where the depletion volume meets the electrodes, decrease due to the increase in voltage dropped across the substrate, which is lightly doped compared to the electrodes. The small but non-zero values of the electric fields at the ends of the plot (corresponding to the electrode centers) are due to approximations in the finite element calculations used for the data plotted in FIG. 5D.

Figure 6:
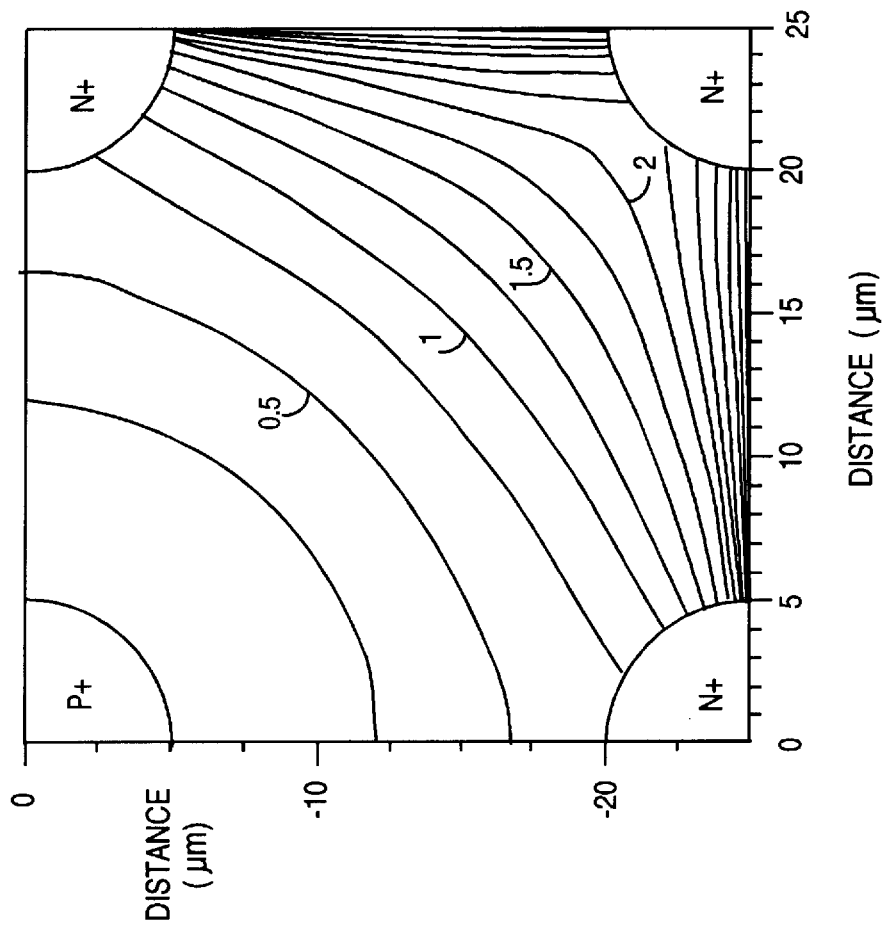
FIG. 6 depicts lines of equal drift time for potential distributions for a quarter-cell, according to the present invention.

FIG. 6 depicts lines of equal drift time for potential distributions for a quarter-cell in which substrate dopant concentration is $10^{12}$/cc and applied potential is 10 V. Zero time is measured from the P+ electrode (shown in upper left corner of FIG. 6) at a radius r=5 *m, and charges are traced backwards. Due to the role played by diffusion, data lines in the immediate vicinity of the zero-field points near the bottom center, and right center in FIG. 6 are not reliable. Further, relatively few tracks are traced backwards to these zero-field regions.

However, FIG. 6 demonstrates that drift time from cell center is less than 1 ns, and that drift times from the other electrodes range from 1 ns to 4 ns. The drift time from the far cell borders is infinity because in those regions the collection field goes to zero. Thus, to obtain realistic drift times for tracks in those regions, one should add diffusion, and for ionization created near or inside electrodes, one should provide the built-in fields. The calculations depicted were carried out using MEDICI.

Figure 7B:
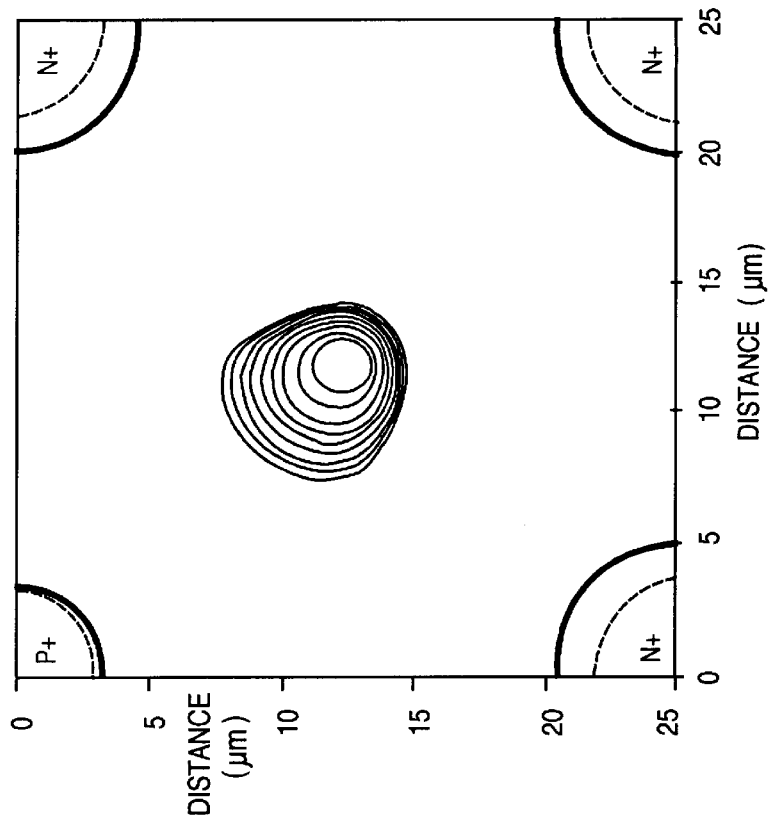
Figure 7A:
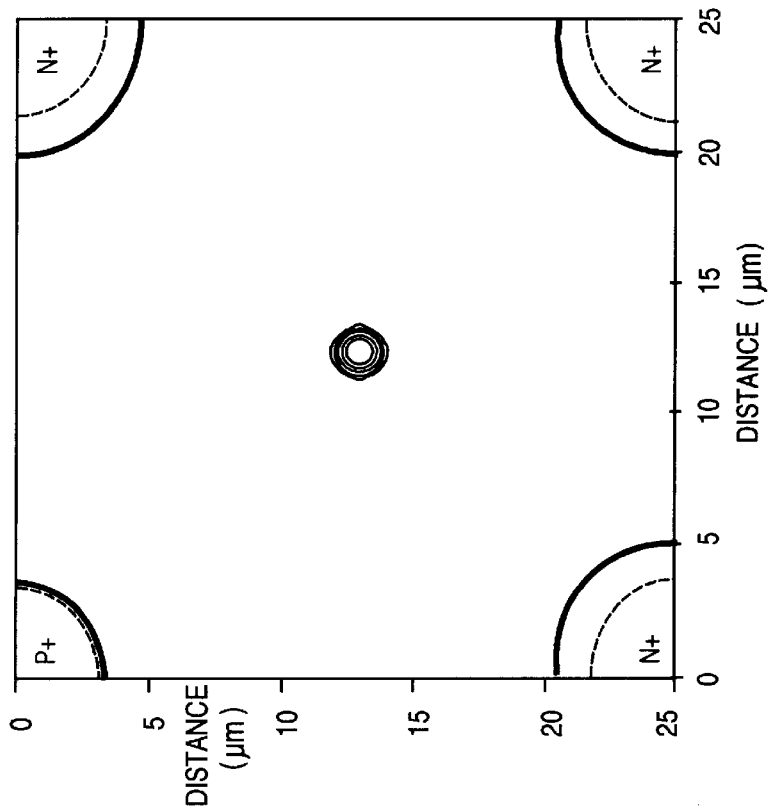

FIG. 7A represents charge density contours (two contours per decade) for electron-hole pairs, for a quarter-cell having 10 V potential, $10^{12}$/cc dopant concentration, for holes starting from the cell center at 0.1 ps. The contours in FIGS. 7A–7L were obtained by starting with an ionization track of 24,000 electron-hole pairs parallel to the electrodes in a quarter-cell such as shown in FIG. 2B. In FIGS. 7A–7E, the ionization tracks were parallel to the electrodes and went through the middle of the cell, which results should be typical of much of the area. In FIGS. 7F–7L, the tracks were through the null point on the border between two cells, which should represent the slowest case.

Figure 7D:
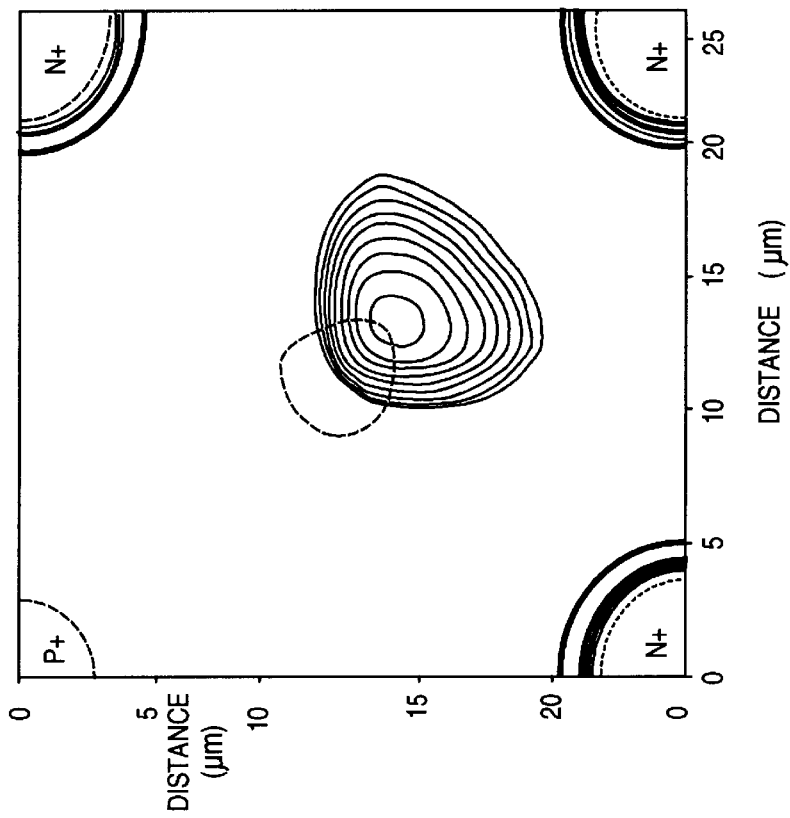
Figure 7C:
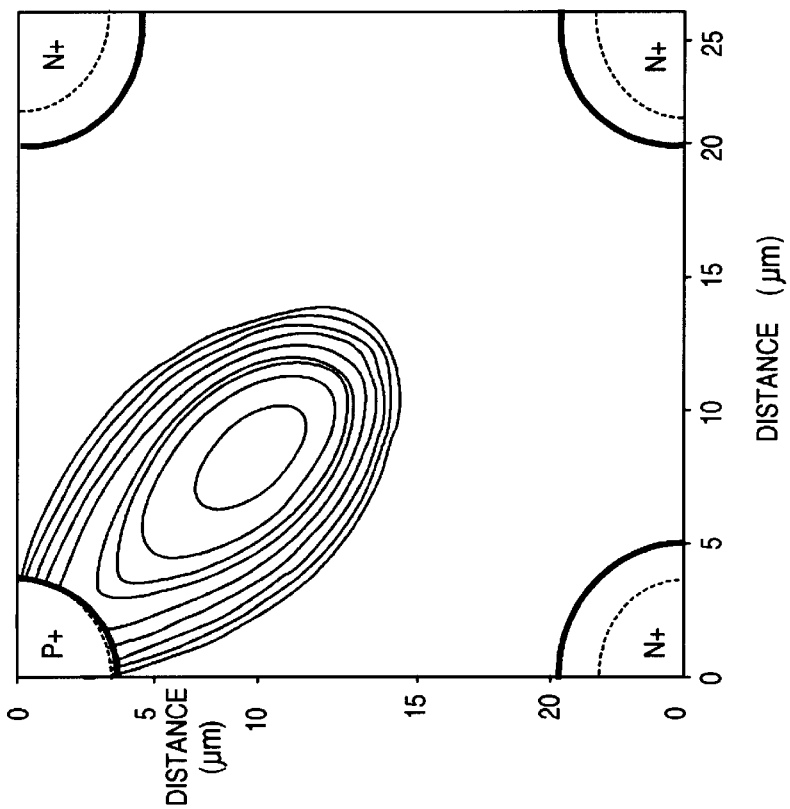
Figure 7H:
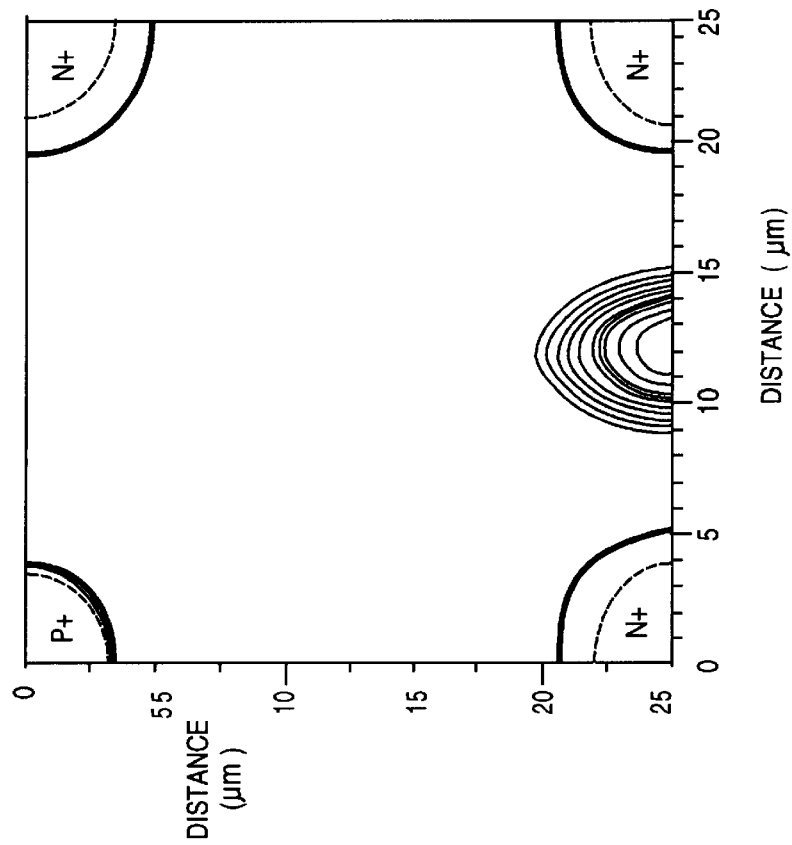
Figure 7G:
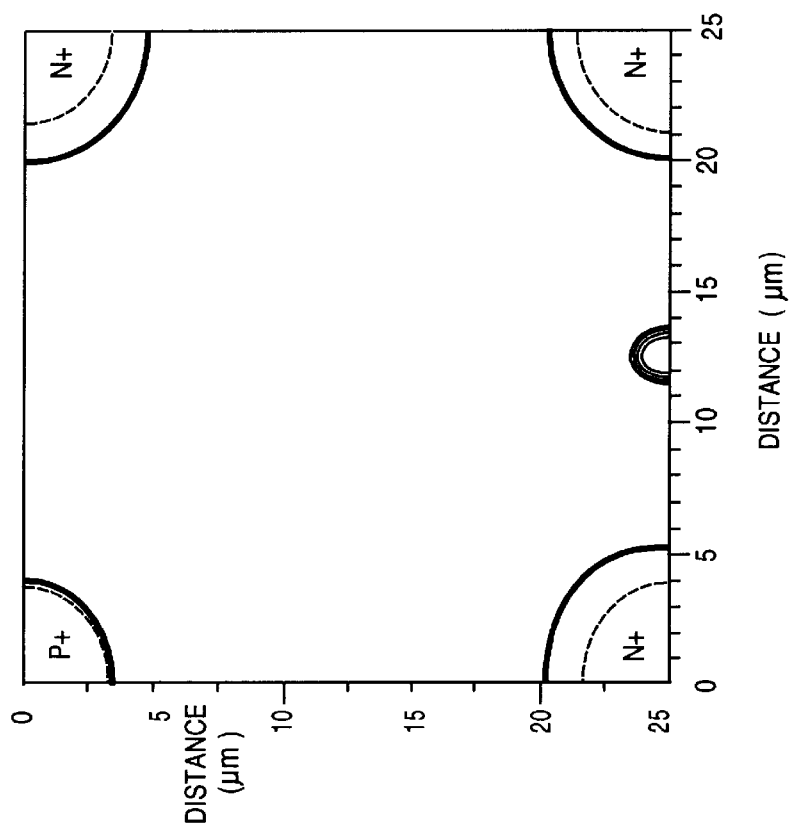
Figure 7J:
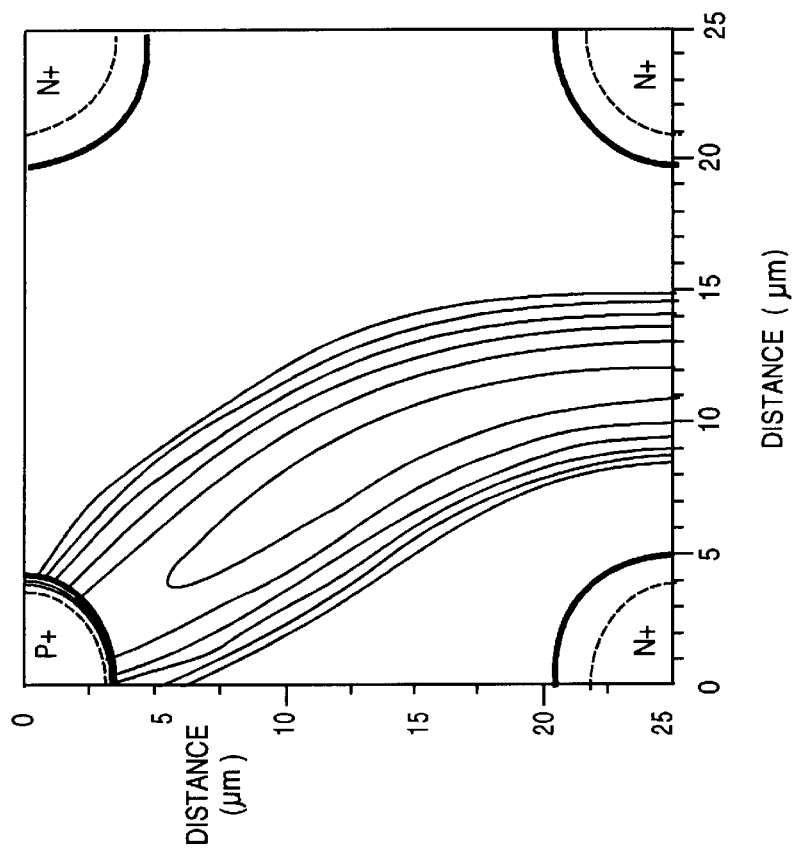
Figure 7I:
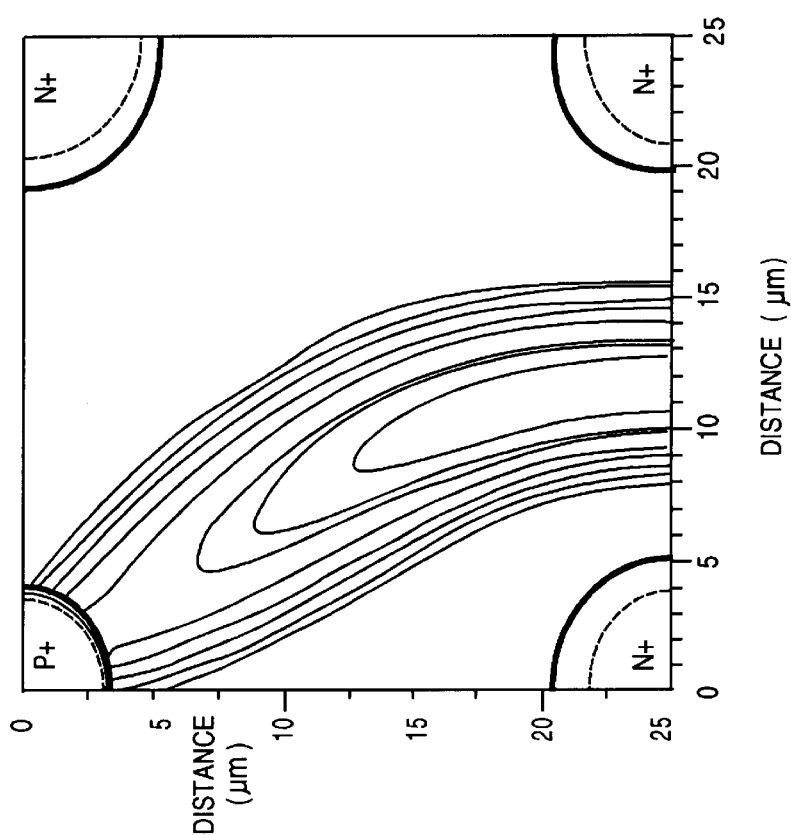

FIG. 7B, and 7C are similar to FIG. 7A except that holes starting from the center are shown at 89 ps and 432 ps, respectively. In FIGS. 7D and 7E, electrons starting from the cell center are shown at 89 ps and 432 ps, respectively, again for 10 V potential and $10^{12}$/cc dopant concentration. FIG. 7F is similar except that electrons starting from the null point are shown at 175 ps. In FIGS. 7G–7L, charge density contours are shown at 0.1 ps, 175 ps, 1.7 ns, 3 ns, 4 ns, and 5 ns, respectively; again for 10 V potential and $10^{12}$/cc dopant concentration, for holes starting from the null point.

Figure 8B:
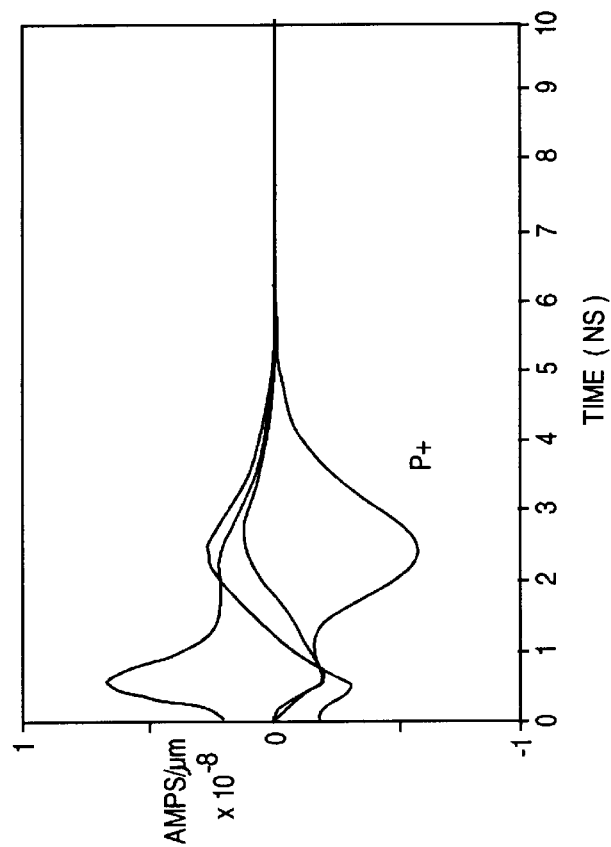
FIGS. 8A and 8B depict current pulses on collection electrodes from tracks parallel to the electrodes, according to the present invention.
Figure 8A:
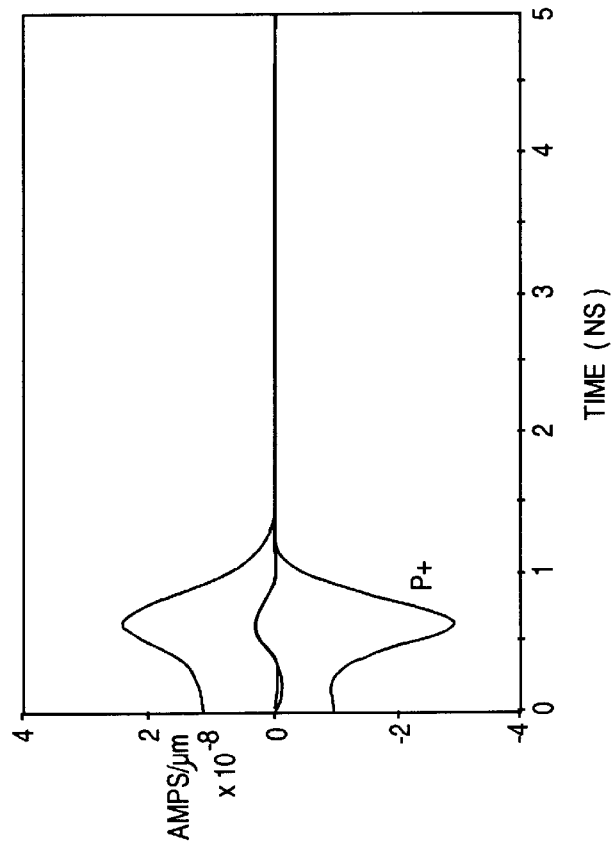

FIG. 8A shows current pulses seen on four collection electrodes (with the P+ electrode pulse specifically labelled) from a track that is parallel to the electrodes and goes through the cell center. FIG. 8B is similar but shows a track going through the null point between two N+ electrodes. FIGS. 8A and 8B include the effects of induced pulses from moving charges and diffusion, but do not include Landau fluctuations or Coulomb forces from the other charges along the track. In FIGS. 8A and 8B, a 10 V potential was used, and dopant concentration was $10^{13}$/cc.

The small difference in FIG. 8A (the midpoint start) between pulses on the two N+ electrodes adjacent the P+ electrode is due to small but non-zero grid effects. Note also that the effects of induced pulses from moving charges can be seen. In FIG. 8A, the current pulse signal peaks at 0.5 ns and returns to the base line at 1.5 ns. This is in stark contrast to the perhaps 25 ns to 40 ns return-to-baseline time required for signals on strip detectors using prior art two-dimensional electrodes (such as shown in FIG. 1). The return-to-baseline time can be important for pile-up considerations, especially since Landau fluctuation effects can be present until all the charge is collected. In FIG. 8B, the current signal pulse on the P+ electrode for the null point track peaks at 2.4 ns, and returns to the baseline at about 6 ns.

It is to be appreciated although the response times reflected in FIGS. 8A and 8B are significantly shorter than typical times for detectors using two-dimensional planar electrodes, these shorter times are obtained with three-dimensional devices having far lower maximum fields. Thus better performance is attainable from devices operated at safer device electric field levels.

The various results thus far described pertain to charge motion in the substrate bulk of a detector having three-dimensional electrodes. However, close to the upper and lower surfaces of such a detector, consideration must be given to the effects of surface charges and indeed of the structure itself.

FIGS. 9A–9F depict calculated equipotentials obtained from a simple two-dimensional model in which the N+ and P+ electrodes were flat slabs. The slab electrodes were separated by a 15 *m region of silicon having $10^{12}$ acceptors/cc and covered with an oxide layer having $10^{11}$ positive interface charges/cm$^2$. The electrodes were at 0.5 μm *m and 20 *m to 25 *m, and were doped throughout at $10^{18}$/cc. The charges were along the top surface, between the electrodes.

Figure 9B:
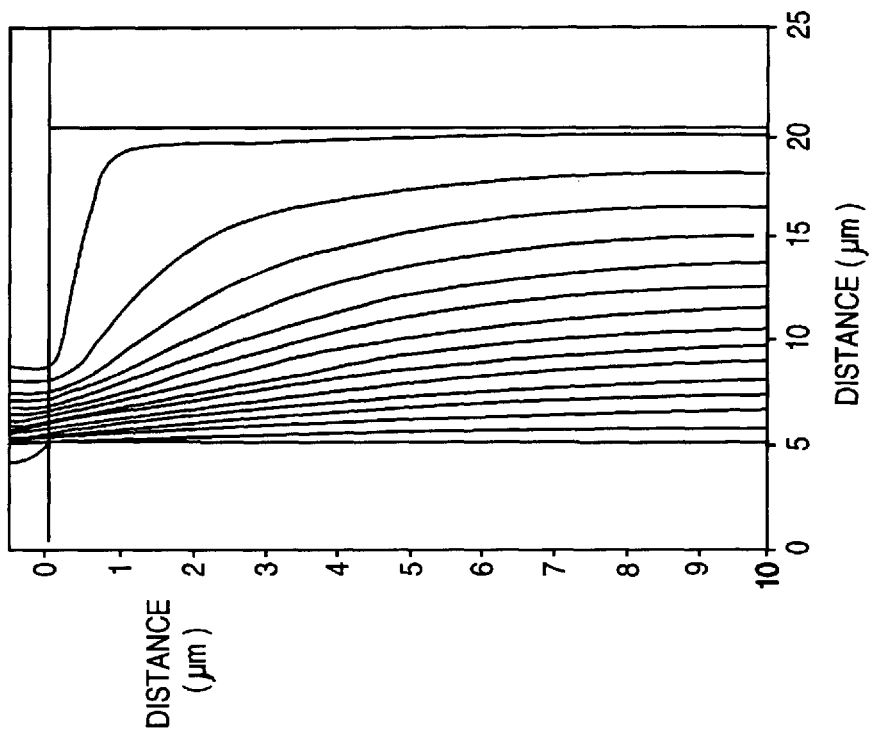
FIGS. 9A–9F depict oxide interface charge effects under varying conditions for a two-dimensional model.
Figure 9A:
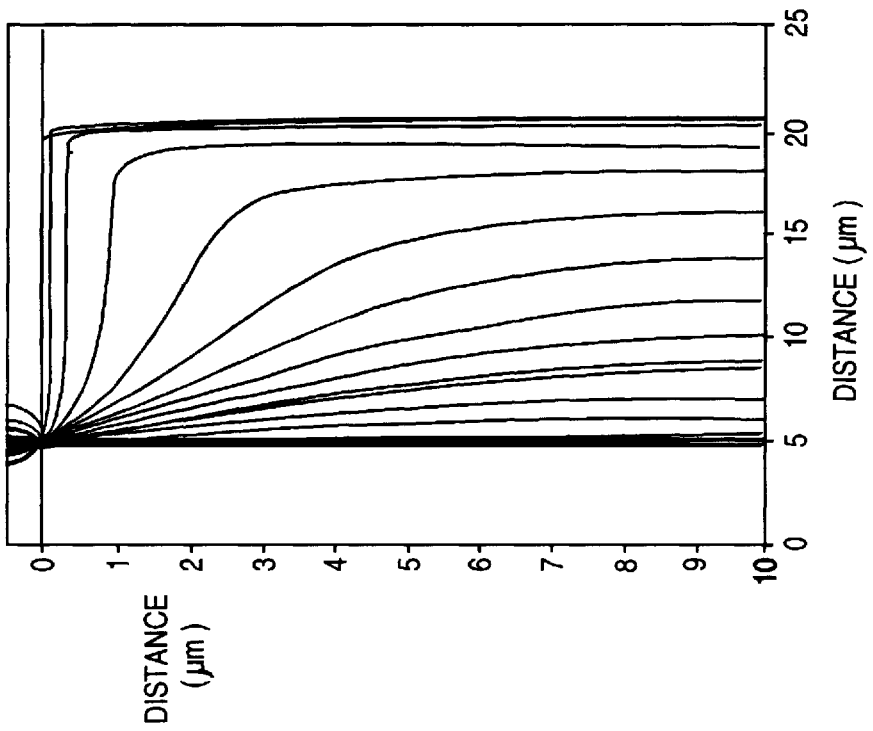
Figure 9D:
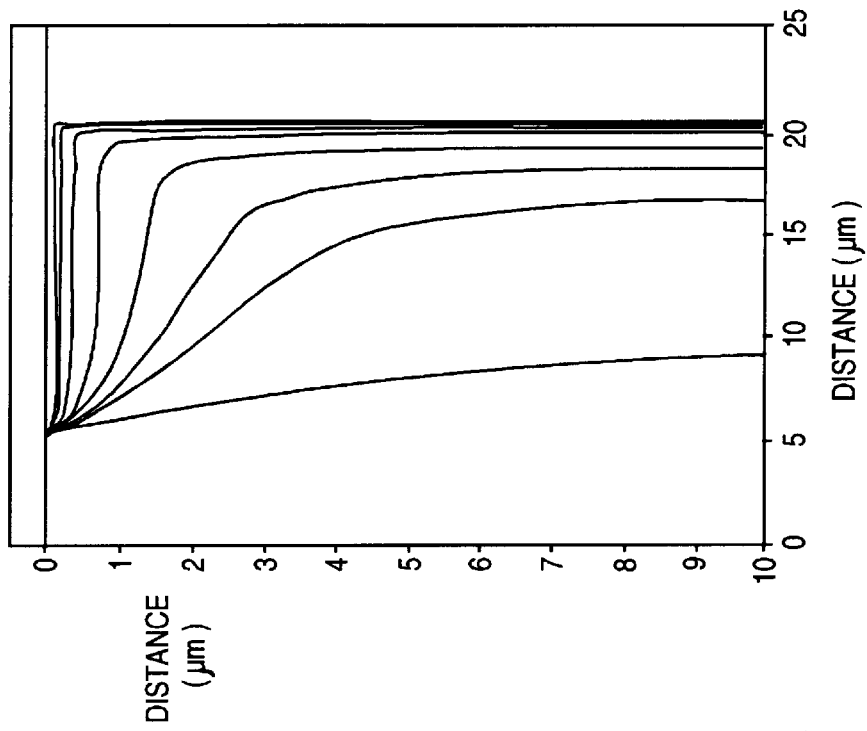
Figure 9C:
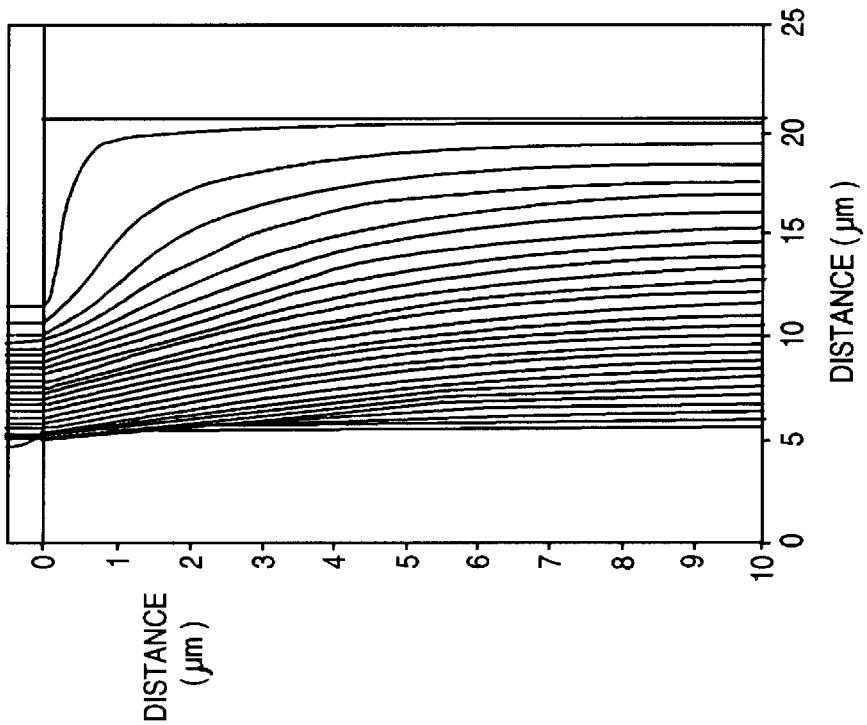
Figure 9F:
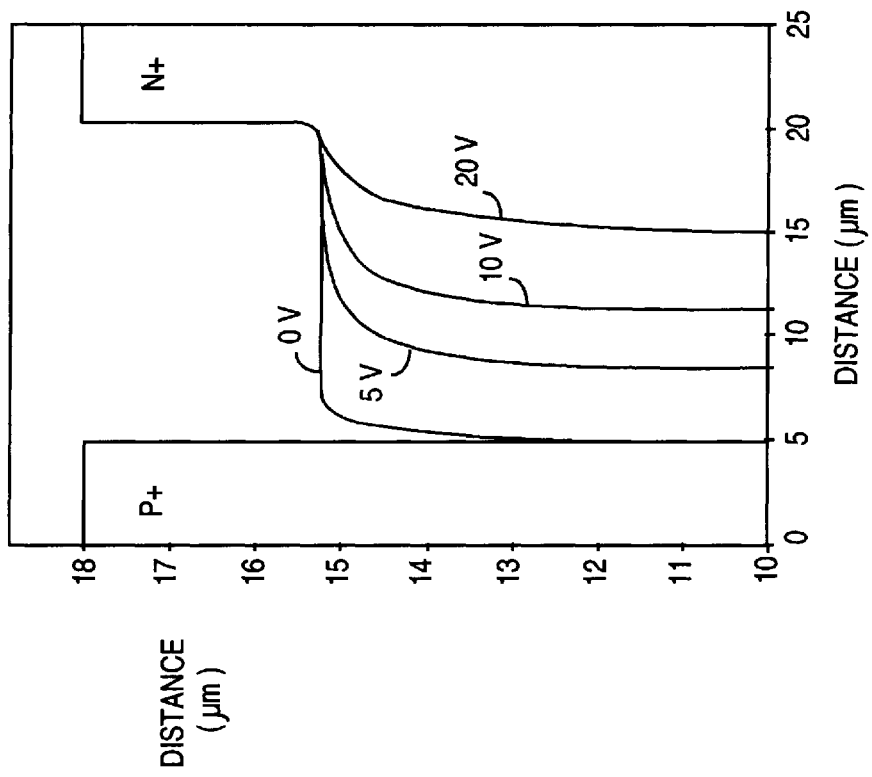
Figure 9E:
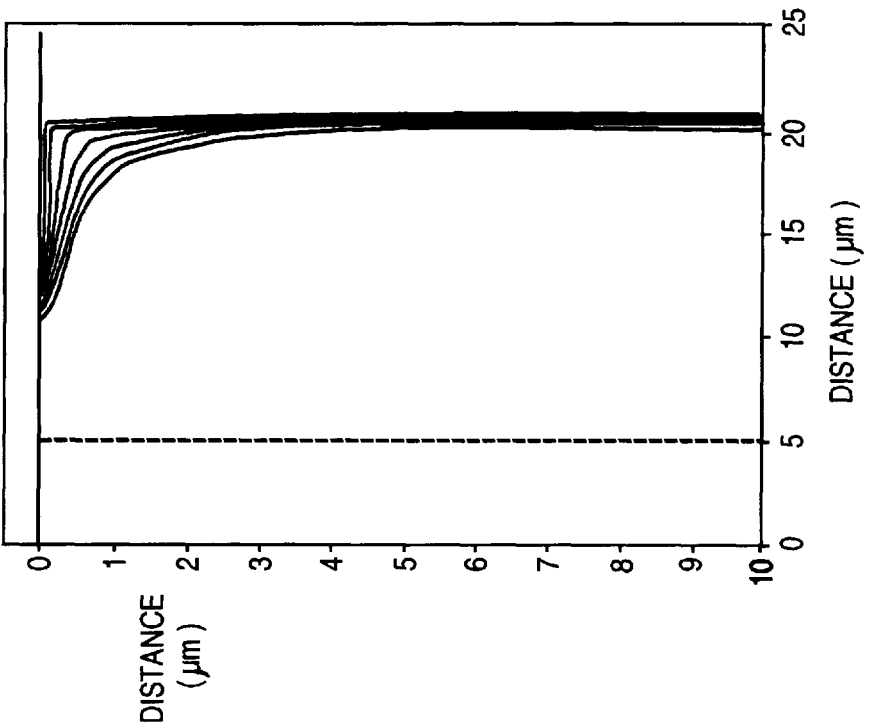

FIG. 9A depicts data for 0 V applied potential. Note the effect of negative charge induced by the oxide charge, as manifested by the closest equipotential line almost parallel to the surface. The contact of the induced charge with the N+ electrode to the right forces equipotentials from the built-in field into a bundle next to the P+ electrode. It follows that the capacitance between the two electrodes will be relatively high. FIG. 9B shows similar equipotentials for 5 V potential, whereas FIG. 9C shows equipotentials for 10 V potential. As the applied potential is increased from 0 V to 10 V, an increasingly wider depletion zone at the surface is apparent. FIGS. 9D and 9E depict electron density contours for 0 V and 10 V potential, respectively. FIG. 9F depicts net carrier concentration at 0.1 *m below the surface for 0 V, 5 V, 10 V and 20 V, with 10 V applied potential.

It is seen in FIGS. 9A–9F that a layer of induced electrons is present that nearly reaches the P+ electrode, and that application of a voltage bias to the electrodes causes a gap to appear. This result suggests that use of P+ guard rings around the top of P+ electrodes may not be needed in practice. However, such guard rings may be needed for radiation damaged oxides with larger surface charges.

Figure 10A:
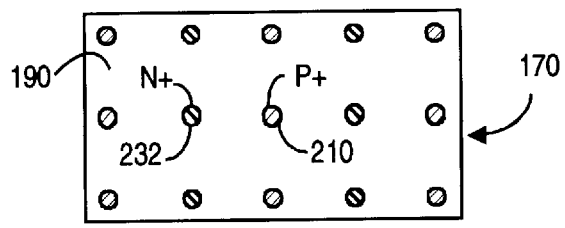
FIGS. 10A, 10B, 10C depict top views of various detector structures, according to the present invention.
Figure 10B:
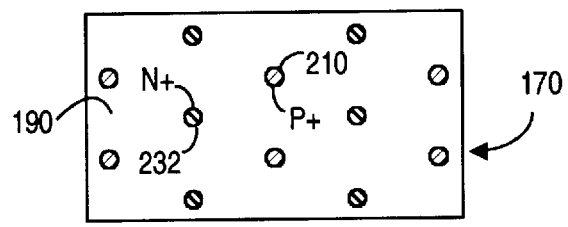
Figure 10C:
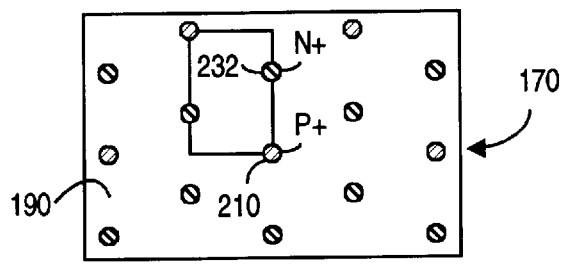

FIGS. 10A–10C depict top views, and FIGS. 10D–10H depict side views of alternative detector structures, according to the present invention. In FIG. 10A, for example, P+ electrodes and N+ electrodes are shown, which electrodes may extend (into the page) through the entire thickness of the surrounding substrate (as do electrodes 210, and 220, for example in FIG. 2B). Alternatively, some or all of these electrodes may extend but a fraction into the substrate. In the embodiment of FIG. 10A, in a plan view there are rows of N+ electrodes and rows of P+ electrodes, arranged in a regular grid-like array. By contrast, in FIG. 10B, there are again rows of P+ and N+ electrodes, but instead of a grid-like array, adjacent rows are staggered or offset from each other. In the hexagon-shaped cell configuration of FIG. 10C, rows are arranged to include repeating groups of two adjacent electrodes of one dopant polarity, one electrode of the opposing dopant polarity.

Several possible detector structures are shown in FIGS. 10D–10H, in which only two electrodes are depicted for ease of illustration. In each of these figures, a portion of detector 170 is shown, in which detector 170 is fabricated on a substrate 180 that includes a P– depleted region 300 having an upper surface 190 and a lower surface 200. As seen from FIGS. 2A and 2B, the distance between surfaces 190 and 200 defines the substrate thickness L. In each of FIGS. 10D–10H, the P+ doped electrode is denoted 210, and the N+ electrode is denoted 240. Electrodes 210, 240 are shown with a somewhat exaggerated lateral extension at upper surface 190, the extensions pointing toward each other in these figures. It is believed that the extension surfaces can improve electrical contact to overlying metal connecting traces (not shown), especially in view of any uneven topography of the IC containing the various detectors.

Figure 10F:
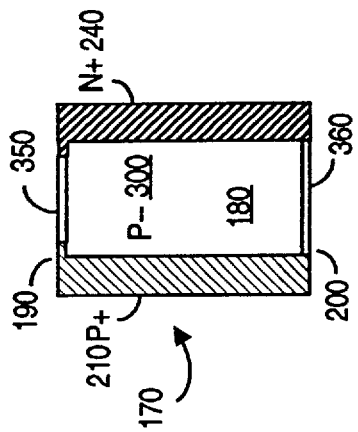
FIGS. 10D, 10E, 10F, 10G, and 10H are side views of various detector structures, according to the present invention.
Figure 10E:
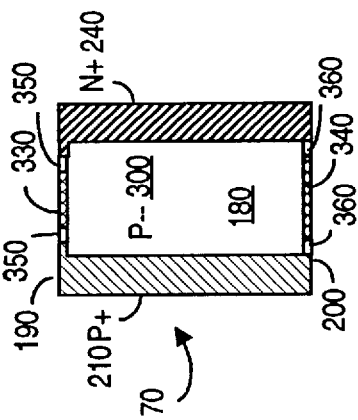
Figure 10D:
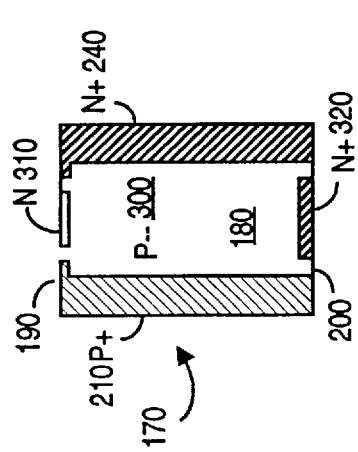

In the configuration of FIG. 10D, an N-well 310 is implanted in a region of the upper substrate surface 190 between the two electrodes, and an N+ layer 320 is implanted in a region between the two electrodes on substrate lower surface 200. N+ layer 320 may advantageously be formed by driving phosphorus into single crystal silicon from a polysilicon layer, thereby providing gettering from both the phosphorus and polysilicon.

The configuration of FIG. 10E is somewhat different in that P+ rings 330, 340 are formed in the region between the two electrodes at the substrate upper and lower surfaces. Note that oxide layer regions 350, 360 separate and isolate the P+ rings from electrodes 210, 240. The configuration of FIG. 10E (as well as that of 10D) would require back side lithography for fabrication. This is not difficult, however, in that the structures are relatively crude and the hole-cylinders provide alignment marks.

In the configuration of FIG. 10F, oxide layers 350 and 360 are formed in the region between the two electrodes at the substrate upper and lower surfaces, respectively. The embodiment of FIG. 10G provides an N-well 310 at upper substrate surface 190 (as in FIG 10D), and provides an oxide layer 360 on the lower substrate surface 200. Note that electrodes 210 and 240 are shown in FIG. 10G as having lengths less than the substrate thickness L. The embodiment of FIG. 10H replaces the oxide layer 360 in FIG. 10G with an N+ layer 370. Note too that the L1, L2, lengths of electrodes 210, 240 are shown as being unequal. It is understood that electrode lengths according to the present invention need not be equal to each other, or to substrate thickness L.

Figure 10H:
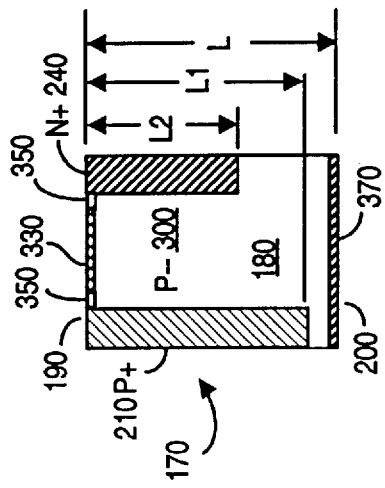
Figure 10G:
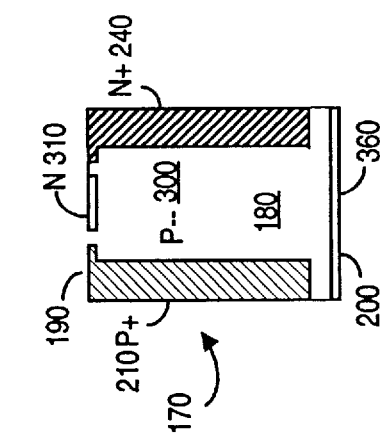

It will be appreciated that the shortened electrode lengths shown in FIGS. 10G and 10H permit implanting a (conducting) N+ layer (e.g., layer 370 in FIG. 10H) without requiring double-sided patterning. In general, cells with N+ layers are easier to deplete, and cells with P+ rings are more difficult to deplete. On the other hand, however, the N+layer, forming an equipotential normally at the same voltage as the N electrodes will make regions with relatively slow drift velocities. (Upper surface wells in monolithic devices would also create such regions.) In practice, these slower drift velocity regions ought not to affect the main portion of a pulse from an ionizing particle, but could add somewhat to the tail portion of the pulse.

It is to be understood that in any or all of the configurations described herein, or fabricated according to the present invention, some or all of the electrodes may have a length L1 that is less than the substrate thickness L, and that the various electrode lengths need not be equal.

Figure 11:
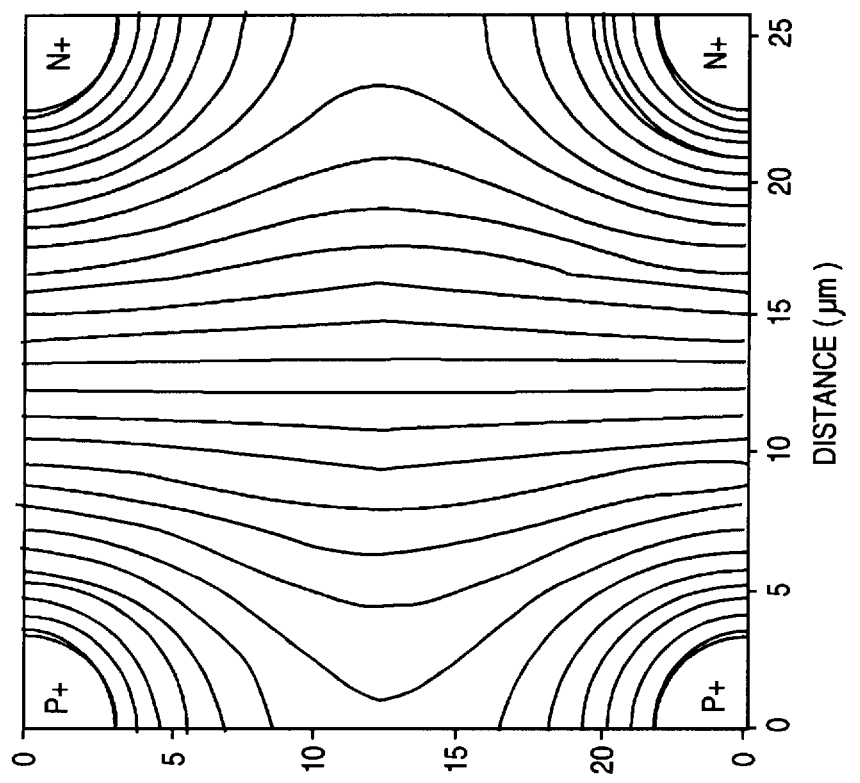
FIG. 11 depicts equipotentials for the cell shown in FIG. 10A, according to the present invention.
Figures 12A, 12B:
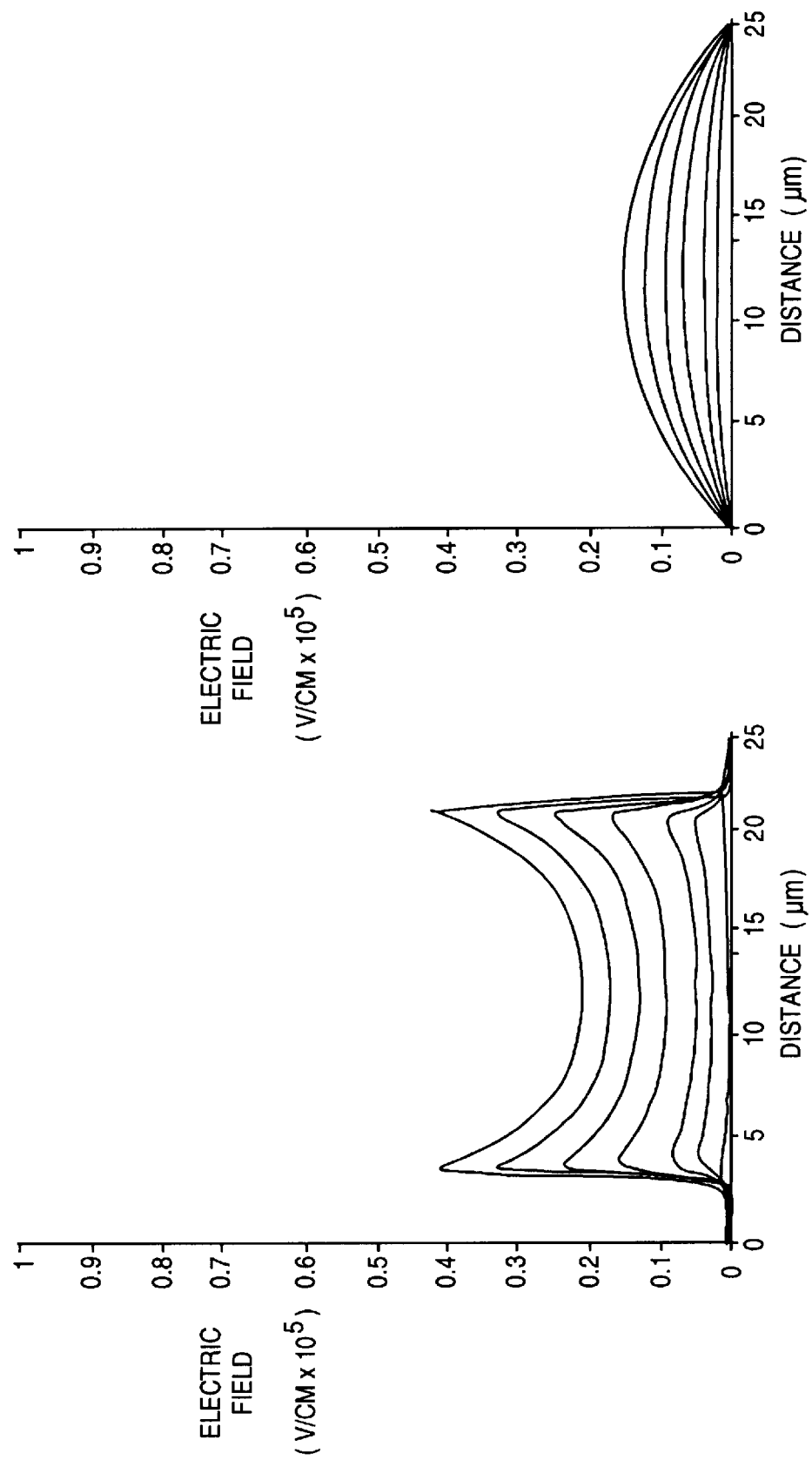
FIG. 12A depicts electric field magnitudes for the cell of FIG. 10A along a line connecting adjacent P+ and N+ electrodes, according to the present invention.
FIG. 12B depicts electric field magnitudes for the cell of FIG. 10A along a horizontal line through the middle of the equipotential graph of FIG. 11, according to the present invention.

FIG. 11 shows equipotentials for one cell of FIG. 10A, for $10^{12}$ net dopant atoms/cc, and 10 V applied bias. FIGS. 12A depicts electric field magnitudes for a cell such as shown in FIG. 10A along a line connecting an N+ electrode with a directly opposite (e.g., adjacent) P+ electrode. For the same cell, FIG. 12B depicts electric field potentials along a mid-point horizontal parallel line through cell middle. (The trace voltages are the same as shown in FIG. 5.)

Figure 13:
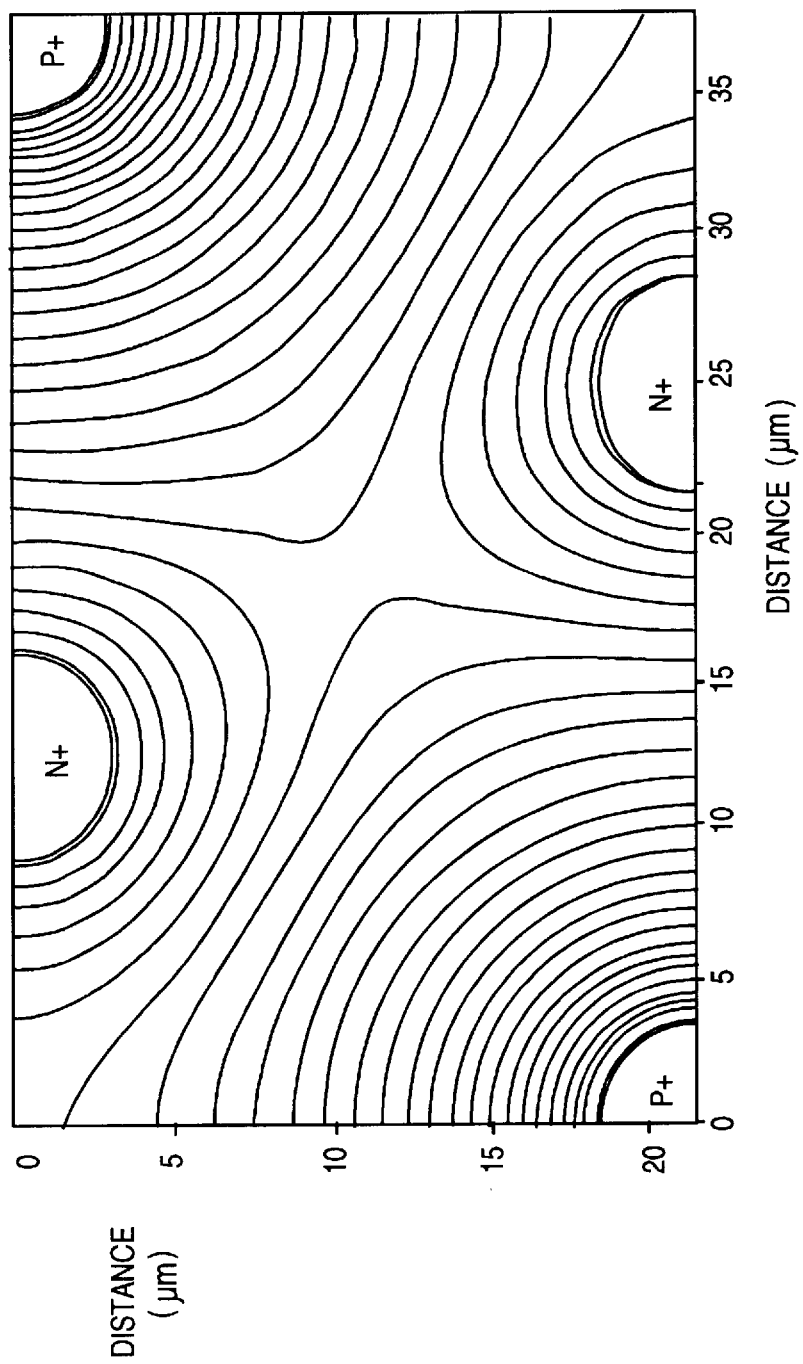
FIG. 13 depicts equipotentials for the cell of FIG. 10C, according to the present invention.

FIG. 13 depicts a potential distribution for the hexagon cell of FIG. 10C, for $10^{12}$ dopant atoms/cc, and 10 V applied bias. If detector 170 were fabricated using polysilicon electrodes 210 and/or 240, it might be beneficial to provide such electrodes having lengths L1, L2<L. This would be especially true if charge collection speed or efficiency for the small number of tracks that are fully contained in the electrodes was less than what is needed for a given application. In such an embodiment, substantially all tracks would generate signals in the region of silicon below the electrodes. Alternatively, one could fabricate two etched-through detectors that would then be glued together with an offset.

Small wells that cover only a portion of the upper substrate surface could be provided to hold simple driving electronics for a fast readout, such as might be used in a mammography detector, among other applications (see FIG. 2A). A two-dimensional readout could be provided using single-sided technology to fabricate electrodes that place differential signals on twin x and twin u or y lines that drive differential receivers. Advantageously, there would be negligible danger of interference between crossing signals, given the double subtraction at the crossing and at the receiver. Signal height would be nearly independent of strip length, and incoherent noise would grow no faster than the square root of the length. For small-angle stereo, readout would be allowed only from the ends since u lines reaching one edge could be crossed over the x lines and brought to the other edge, whence they would continue at their stereo angle.

The role of charge collection from electrodes in the present invention will now be described. Charge from tracks contained within electrodes will leave the electrodes by diffusion. In addition, if epi electrodes are used, charge will also leave because of the electric forces due to the built-in fields. Coulomb forces within the ionization charge cloud itself can either hinder or help charge collection, once part of the charge has been collected. For example, in the case of floating N+ electrodes, once some holes have diffused-out to the collection field and have been removed, the net negative charge will tend to attract the remaining holes, slowing their diffusion out of the electrode. If, however, the electrons have been collected by electronics coupled to the N+ electrode, there will be a net repulsion that will hasten hole collection.

Table 1, below, depicts pulse times for tracks at a radius r within an N+ electrode centered in a 50 *m×50 *m cell, a cell such as that shown in FIG. 2B for example. For polysilicon electrodes, the electric field within the electrode is assumed to come only from other holes (e⁻out—electrode coupled to electronics collecting the electrons) or from both holes and electrons (e⁻in). Estimated errors in the times range from 5% to 10%. For polysilicon electrodes, the time to collect 90% of the charge will be about three times that required to collect 50%.

TABLE 1

| track r band | 1.0 | 2.0 | 3.0 | 4.0 | 5.0 | µm |
|---|---|---|---|---|---|---|
| rmin | 0.0 | 1.5 | 2.5 | 3.5 | 4.5 | µm |
| rmax | 1.5 | 2.5 | 3.5 | 4.5 | 5.0 | µm |
| band area cell area | 0.283 | 0.503 | 0.754 | 1.005 | 0.597 | % |
| solid angle/π | 0.0025 | 0.0069 | 0.014 | 0.023 | 0.028 | % |
| time-epi | | | | | | |
| peak | 2.9 | 2.7 | 2.3 | 2.2 | 2.1 | ns |
| .5 Σq | 3.1 | 2.7 | 2.3 | 2.1 | 2.0 | ns |
| time-poly, e out | | | | | | |
| peak | 4.5 | 4.1 | 3.5 | 2.4 | 1.9 | ns |
| .5 Σq | 6.6 | 5.8 | 4.3 | 2.8 | 1.9 | ns |
| time-poly, e in | | | | | | |
| peak | 5.1 | 4.7 | 3.5 | 2.5 | 2.0 | ns |
| .5 Σq | 8.3 | 6.8 | 4.7 | 3.1 | 1.9 | ns |

The fraction of tracks contained entirely within an electrode will depend upon the tracks' angular distribution, as well as upon the electrode cross-sectional area. Table 1 shows, for example, at row 4 the percentage of a 50 µm×50 µm square cell occupied by radial bands for an N+ electrode between two p+ ones of FIG. 3C. Table 1 further shows the probability for the track to remain inside the band outer radius, for a beam distributed uniformly over π steradians centered around the normal to the detector.

The probability for the entire track to stay within rmax is the product of the band area and solid angle factors. For a more tightly aligned beam, the product increases to that of the area fraction alone, although for very tightly aligned beams, the detector can be tilted, reducing the fully contained fraction to zero. The following two rows in Table 1 show the times to the pulse peak and to the 50% charge collection time for 10 V applied voltage and epi electrodes. The following two rows then show similar times for polysilicon electrodes (without the built-in fields), and with electrons collected by the attached electronics. Finally, the last two rows depict data for floating polysilicon electrodes, with the electrons left in the electrode. Tracks will also be contained within the P+ electrode and the two adjacent N+ electrodes, which will roughly triple the area fractions given in Table 1. The times for these electrodes will be shorter than the times for the N+ electrodes, tabulated above.

Having described the present invention in detail, several general conclusions and architectural design guidelines may be drawn. When it is necessary to minimize electric fields, electrodes forming diode junctions should have more total surface area than those forming ohmic junctions. N+ electrodes with phosphorus doping serve as getters, and preferably their electrode area is maximized, consistent with other design requirements. P− substrate material is preferred to prevent type change from bulk radiation damage, and indeed data exist indicating that P− silicon is less subject to bulk damage than N− material. (Bulk damage-induced type change may not be inevitably lethal in all implementations, however.)

According to the above design guidelines, a P− substrate should be used with a P electrode that transmits signals from the entire pixel, while PN diode junctions are formed between multiple N electrodes and the substrate. However, signals could be taken from the N electrodes, further subdividing the pixel and promoting faster signal collection speed. In practice, monolithic technology is likely to be needed for the smallest readout pitches, e.g., spaced-apart distances. With sufficiently fast electronic circuits, improved position and time information may also be provided by comparing the various P electrode and N electrode signal times and signal pulse heights.

In a bump-bonded pixel detector system, many N electrodes may be coupled together (e.g., with metal or diffusion conductive traces) to reduce the number of bumps required, and to provide a measure of redundancy. If IC chip area needed for on-chip electronics in the pixel causes pixel area to exceed the area of the underlying bulk cell, conductors may join P electrodes from one or more other cells to the pixel electronics. However, the penalties for so doing will include increased capacity $\Sigma C_i$, a reduced signal $q/\Sigma C_i$, and a reduced signal-to-noise ratio. In such case, a single, simple front-end circuit per cell with an input signal $q/C_i$ may be a better design choice. This design might be better because random noise of the sum increases, and signal-to-noise ratio decreases but at most only as the square root of the number of cells. (For example, if one source-follower from each cell were used to drive a common pixel bus, a follower with a signal will tend to cut off those without, and only the noise on that channel would be present.)

When on-wafer metal lines are used, preferably the outer faces of the electrodes are in contact with, and surrounded by, an implanted ring of like-polarity dopant to promote good contact. This practice is desired as the silicon surface directly above the electrodes may not be fully planar.

Silicon surfaces may be inverted by charges in surface field oxide layers. Thus, for a P-substrate, inversion could result in a continuous N conductor from the N electrodes to the immediate vicinity of the P electrodes. The resultant small gap could result in increased electrode capacity and electric fields. On one hand, this gap would be enlarged by the applied depletion voltage, but on the other hand, increased oxide charge due to radiation damage might reduce the gap. To prevent this, P+ guard rings may be formed around the P electrode or a blanket P implant may be used. Implanted rings are recommended for use in test devices to monitor surface leakage currents.

An exemplary sequence of process steps to produce bump-bonded diodes according to the present invention will now be given, in which routine wafer cleaning and process checking steps are not enumerated. Of course, even the enumerated steps may have many sub-steps, not listed here, and other fabrication steps and procedures may instead be used. For example, masking steps will involve spinning on photoresist, a low temperature bake, exposure in a mask aligner, photoresist development, a high temperature bake, the masked process per se (e.g., ion implantation or etching), and photoresist stripping. Even a simple sub-step such as spinning on photoresist will have its own sub-steps.

An exemplary fabrication process would include the following steps:

(1) Mask 1: alignment mark mask and etch;
(2) Mask 2: N electrode mask and wafer etch-through;;
(3) N+ silicon deposition and hole fill (e.g., using a silane/phosphine gas mixture)
(4) Etch back deposited silicon on both wafer surfaces
(5) Mask 3: P electrode mask and wafer etch-through
(6) P+ silicon deposition and hole fill (e.g., using a silane/diborane gas mixture)
(7) etch back deposited silicon on both wafer surfaces
(8) Thermal oxidation (e.g., 0.6 $\mu$m oxide thickness)
(9) Etch oxide,backside
(10) Backside blanket P+ implant (optional step, to prevent oxide charges from inverting the adjacent silicon; alternatively, a masking step forming P+ rings to increase the N+/P+ separation could be used)
(11) Thermal oxidation (e.g., 0.6 $\mu$m oxide thickness, however if optional step 10 is omitted, steps 9 and 11 are also omitted.)
(12) Mask 4: front side N+ mask and implant to provide a planar ohmic contact to the N+ electrodes as silicon fill at the electrode surfaces will not necessarily be flat
(13) Mask 5: front side P+ mask and implant to provide planar ohmic contact to P+ electrodes and surrounding guard rings if rings are used to monitor current
(14) Anneal implants
(15) Low temperature oxide ("LTO") deposition
(16) Mask 6: contact mask and etch
(17) Aluminum deposition
(18) Mask 7: metal mask and etch Modifications and variations may be made to the disclosed embodiments without departing from the subject and spirit of the invention as defined by the following claims. For example, a GaAs detector fabricated according to the present invention should realize collection times of 1 ns or substantially less, maximum drift distances should no longer be a significant limitation for such detectors.

What is claimed is:

1. A radiation-damage resistant radiation detector having non-planar electrodes, comprising:
   a substrate formed of a material doped with a first conductivity type dopant and having a first surface and a second surface spaced-apart by a substrate thickness of at least about 50 $\mu$m;
   at least one first collection electrode formed of said first conductivity type dopant and penetrating from a chosen one of said first surface and said second surface into said substrate; and
   at least one second collection electrode formed of a second conductivity type dopant and penetrating from a chosen one of said first surface and said second surface into said substrate;
   at least one of said first collection electrode and said second collection electrode penetrating into said substrate a distance exceeding about 5% of said substrate thickness;
   said first collection electrode and said second collection electrode being spaced-apart from each other such that radiation-released holes and electrons traverse a collection distance less than said substrate thickness to be collected by at least a portion of one of said first collection electrode and said second collection electrode.

2. The detector of claim 1, wherein at least one said first collection electrode and said second collection electrode has a dopant profile graded radially in a plane parallel to said first surface of said substrate.

3. The detector of claim 1, wherein at least one of said first collection electrode and said second collection electrode is formed from at least one material selected from a group consisting of (i) polysilicon doped with a chosen conductivity type dopant, (ii) epitaxial silicon doped with a chosen conductivity type dopant, (iii) trimethyl gallium and arsine, and (iv) dopants appropriate for a substrate other than silicon or gallium arsenide.

4. The detector of claim 1, wherein at least one of said first collection electrode and said second collection electrode penetrates into said substrate a distance equal to 100% of said substrate thickness.

5. The detector of claim 1, wherein said first collection electrode and said second collection electrode have a spatial relationship selected from a group consisting of (i) said first collection electrode and said second collection electrode each penetrate into said substrate from opposite surfaces of said substrate, (ii) said first collection electrode and said second collection electrode each penetrate into said substrate from a common surface of said substrate, (iii) said first collection electrode penetrates more deeply into said substrate than does said second collection electrode, (iv) said first collection electrode penetrates from said first surface through said substrate into said second surface, and (v) said first collection electrode and said second collection electrode each penetrate from said first surface through said substrate into said second surface.

6. The detector of claim 1, wherein said first collection electrode and said second collection electrode are separated by a spaced-apart distance having at least one attribute selected from a group consisting of (i) said spaced-apart distance ranges from about 0.1 μm to about said substrate thickness measured from collection electrode center-to-center, and said spaced-apart distance is sufficiently small to permit radiation-released charge in said substrate to be detected within a time ranging from about 0.01 ns to about 10 ns.

7. The detector of claim 1, wherein when an externally applied potential is coupled between said first collection electrode and said second collection electrode, said potential affects said detector in at least one manner selected from a group consisting of (i) said potential promotes depletion of said substrate in addition to substrate self-depletion, (ii) said potential increases magnitude of an electric field present between said first collection electrode and said second collection electrode, and (iii) said potential promotes an electric field that guides radiation-released charge in said substrate to one of said first collection electrode and said second collection electrode for collection;

wherein said externally applied potential has a magnitude ranging from 0 VDC to about 100 VDC.

8. The detector of claim 1, wherein spaced-apart spacing between said first collection electrode and said second collection electrode is such that a radiation-detected signal between said first collection electrode and said second collection electrode has a non-zero time duration of less than about 5 ns.

9. The detector of claim 1, wherein said first collection electrode defines a columnar shape having a transverse dimension ranging from about 0.5 μm to about 25 μm.

10. The detector of claim 1, wherein if said first conductivity type dopant is P-type then said second conductivity type dopant is N-type, and if said first conductivity type dopant is N-type then said second conductivity type dopant is P-type.

11. The detector of claim 1, wherein said substrate includes at least one material selected from a group consisting of (i) silicon, (ii) germanium, (iii) gallium arsenide, and (iv) cadmium zinc telluride.

12. The detector of claim 1, wherein said substrate thickness is about 10 mm.

13. The detector of claim 1, wherein at about 20° C. ambient, following at least one condition selected from a group consisting of (i) a net imbalance of radiation-induced acceptor, and (ii) donor sites exceeding about $10^{12}/cm^3$ to about $10^{13}/cm^3$, said radiation detector continues to detect without requiring application of an external substrate depletion voltage so large in magnitude as to cause said detector to experience a condition selected from a group consisting of (a) excessive leakage current, and (b) voltage breakdown of said substrate.

14. The detector of claim 1, further including means for reading-out radiation detected by said detector, said means for reading-out having a configuration selected from a group consisting of (i) said means for reading-out is fabricated as a separate integrated circuit that is bump-bonded to a surface of said substrate, (ii) said means for reading-out is fabricated as a strip on a surface of said substrate, (iii) said means for reading-out and said detector are fabricated as a monolithic detection unit, and (iv) said substrate includes an isolation well in which said means for reading-out is fabricated.

15. The detector of claim 1, further including a first plurality of said first collection electrodes and a second plurality of said second collection electrodes, said first and second plurality defining a regular pattern on a plane parallel to said first surface of said substrate.

16. A radiation-damage resistant radiation detector having non-planar electrodes, comprising:

a substrate formed of a material doped with a first conductivity type dopant and having a first surface and a second surface spaced-apart by a substrate thickness;

a first plurality of first collection electrodes formed of said first conductivity type dopant and penetrating from a chosen one of said first surface and said second surface into said substrate a distance ranging from about 5% to 100% of said substrate thickness; and a second plurality of second collection electrodes formed of a second conductivity type dopant and penetrating from a chosen one of said first surface and said second surface into said substrate a distance ranging from about 5% to 100% of said substrate thickness;

said first collection electrodes and said second collection electrodes being spaced-apart from each other such that radiation-released holes and electrons traverse a collection distance less than said substrate thickness to be collected by at least a portion of one of said first collection electrode and said second collection electrode;

wherein at least one of said first collection electrode and said second collection electrode has a dopant profile graded radially in a plane parallel to said first surface of said substrate.

17. The detector of claim 16, wherein said first collection electrodes and said second collection electrodes have a spatial relationship selected from a group consisting of (i) said first collection electrodes and said second collection electrodes each penetrate into said substrate from opposite surfaces of said substrate, (ii) said first collection electrodes and said second collection electrodes each penetrate into said substrate from a common surface of said substrate, (iii) some said first collection electrodes penetrate more deeply into said substrate than do some said second collection electrodes, (iv) some said second collection electrodes penetrate more deeply into said substrate than do some said first collection electrodes, and (v) all said first collection electrodes have a first electrode length and all said second collection electrodes have a second electrode length, wherein a ratio of said first electrode length to said second electrode length has a characteristic selected from a group consisting of (a) said ratio=1, (b) said ratio>1, and (c) said ratio <1.

18. The detector of claim 16, further including:

an isolation well fabricated in said substrate; and read-out circuitry, fabricated in said isolation well, coupled to an end portion of each of said first collection electrodes and said second collection electrodes; wherein radiation-released charge collected by any of said first collection electrodes and said second collection electrodes are read-out by said read-out circuitry.

19. The detector of claim 16, wherein:

said first collection electrodes have a columnar shape with a transverse dimension ranging from about 0.5 µm to about 25 µm; and closest ones of said first collection electrodes and said second collection electrodes are spaced-apart from each other a distance ranging from about 0.1 µm to about said substrate thickness measured from collection electrode center-to-center.

* * * * *